United States Patent
Ishida et al.

(10) Patent No.: US 12,349,357 B2
(45) Date of Patent: Jul. 1, 2025

(54) NON-VOLATILE MEMORY DEVICE

(71) Applicant: Kioxia Corporation, Tokyo (JP)

(72) Inventors: Takashi Ishida, Yokkaichi (JP);
Yoshiaki Fukuzumi, Yokkaichi (JP);
Takayuki Okada, Kuwana (JP);
Masaki Tsuji, Yokkaichi (JP)

(73) Assignee: Kioxia Corporation, Tokyo (JP)

( * ) Notice: Subject to any disclaimer, the term of this patent is extended or adjusted under 35 U.S.C. 154(b) by 0 days.

(21) Appl. No.: 18/624,967

(22) Filed: Apr. 2, 2024

(65) Prior Publication Data

US 2024/0251559 A1 Jul. 25, 2024

Related U.S. Application Data

(63) Continuation of application No. 17/128,915, filed on Dec. 21, 2020, now Pat. No. 11,980,031, which is a continuation of application No. 16/411,307, filed on May 14, 2019, now Pat. No. 10,916,562, which is a continuation of application No. 15/928,951, filed on Mar. 22, 2018, now Pat. No. 10,340,285, which is a continuation of application No. 15/388,510, filed on
(Continued)

(51) Int. Cl.
| | |
|---|---|
| *H01L 23/48* | (2006.01) |
| *H01L 23/52* | (2006.01) |
| *H10B 43/10* | (2023.01) |
| *H10B 43/27* | (2023.01) |
| *H10B 43/35* | (2023.01) |
| *H10D 30/69* | (2025.01) |
| *H10D 62/17* | (2025.01) |

(52) U.S. Cl.
CPC .......... *H10B 43/27* (2023.02); *H10B 43/10* (2023.02); *H10B 43/35* (2023.02); *H10D 30/694* (2025.01); *H10D 62/292* (2025.01)

(58) Field of Classification Search
CPC ......... H10B 43/27; H10B 41/27; H10B 41/35
See application file for complete search history.

(56) References Cited

U.S. PATENT DOCUMENTS 7,847,342 B2 12/2010 Fukuzuml et al.
7,859,066 B2 12/2010 Kito
(Continued)

OTHER PUBLICATIONS

Yoshiaki Fukuzumi, et al., "Optimal Integration and Characteristics of Vertical Array Devices for Ultra-High Density, Bit-Cost Scalable Flash Memory", IEDM, 2007, pp. 449-452.

*Primary Examiner* — Kyoung Lee
*Assistant Examiner* — David J Goodwin
(74) *Attorney, Agent, or Firm* — Oblon, McClelland, Maier & Neustadt, L.L.P.

(57) ABSTRACT

According to an embodiment, a non-volatile memory device includes first electrodes stacked on an underlying layer, a second electrode provided on the first electrodes, a semiconductor layer extending in a first direction from the underlying layer to the second electrode, and a memory film provided between each of the first electrodes and the semiconductor layer. The semiconductor layer includes a first portion adjacent to the first electrodes and a second portion adjacent to the second electrode. The second portion has a thickness thinner than a thickness of the first portion in a second direction perpendicular to the first direction.

20 Claims, 15 Drawing Sheets

Related U.S. Application Data

Dec. 22, 2016, now Pat. No. 9,991,278, which is a continuation of application No. 14/483,521, filed on Sep. 11, 2014, now Pat. No. 9,583,505.

(60) Provisional application No. 62/008,343, filed on Jun. 5, 2014.

(56) References Cited

U.S. PATENT DOCUMENTS

| | | |
|---|---|---|
| 8,178,919 B2 | 5/2012 | Fujiwara |
| 8,278,695 B2 | 10/2012 | Kidoh et al. |
| 8,476,766 B2 | 7/2013 | Tanaka |
| 8,624,316 B2 | 1/2014 | Mizushima |
| 8,653,582 B2 * | 2/2014 | Fukuzumi ............ H10D 30/693 257/326 |
| 8,669,608 B2 | 3/2014 | Sato |
| 8,766,446 B2 * | 7/2014 | Kuge ..................... H10B 43/35 257/E21.294 |
| 10,340,285 B2 * | 7/2019 | Ishida .................. H10D 30/694 |
| 2010/0072538 A1 | 3/2010 | Kito |
| 2010/0117137 A1 | 5/2010 | Fukuzumi |
| 2010/0148237 A1 | 6/2010 | Kito |
| 2010/0213538 A1 | 8/2010 | Fukuzmi |
| 2011/0147824 A1 | 6/2011 | Son |
| 2011/0316064 A1 | 12/2011 | Kim |
| 2012/0068242 A1 | 3/2012 | Shin |
| 2012/0068354 A1 | 3/2012 | Tanaka |
| 2012/0146127 A1 | 6/2012 | Lee |
| 2012/0156848 A1 | 6/2012 | Yang |
| 2012/0168824 A1 | 7/2012 | Lee |
| 2013/0109158 A1 | 5/2013 | Lee |
| 2013/0119456 A1 | 5/2013 | Kito et al. |
| 2013/0234235 A1 | 9/2013 | Matsuda et al. |
| 2014/0001544 A1 | 1/2014 | Sato et al. |

* cited by examiner

NON-VOLATILE MEMORY DEVICE

CROSS REFERENCE TO RELATED APPLICATIONS

This application is a continuation of and claims benefit under 35 U.S.C. § 120 to U.S. application Ser. No. 17/128,915, filed Dec. 21, 2020, which is a continuation of and claims benefit under 35 U.S.C. § 120 to U.S. application Ser. No. 16/411,307, filed May 14, 2019 (now U.S. Pat. No. 10,916,562), which is a continuation of and claims benefit under 35 U.S.C. § 120 to U.S. application Ser. No. 15/928,951, filed Mar. 22, 2018 (now U.S. Pat. No. 10,340,285), which is a continuation of and claims benefit under 35 U.S.C. § 120 to U.S. application Ser. No. 15/388,510, filed Dec. 22, 2016 (now U.S. Pat. No. 9,991,278), which is a continuation of and claims benefit under 35 U.S.C. § 120 to U.S. application Ser. No. 14/483,521, filed Sep. 11, 2014 (now U.S. Pat. No. 9,583,505), which is based upon and claims the benefit of priority under 35 U.S.C. § 119(e) from U.S. Provisional Application No. 62/008,343 filed on Jun. 5, 2014, the entire contents of each of which are incorporated herein by reference.

FIELD

Embodiments are generally related to a non-volatile memory device.

BACKGROUND

A memory cell array of three-dimensional structure has been developed to realize a next-generation non-volatile memory device. The memory cell array of three-dimensional structure includes a plurality of stacked word lines, and memory cells formed inside a memory hole piercing through the word lines. Furthermore, a select gate transistor is also provided in the memory hole to allow access to a specified memory cell. The select transistor preferably has the cutoff characteristic such that the off-current is effectively suppressed.

DETAILED DESCRIPTION

Figure 1:
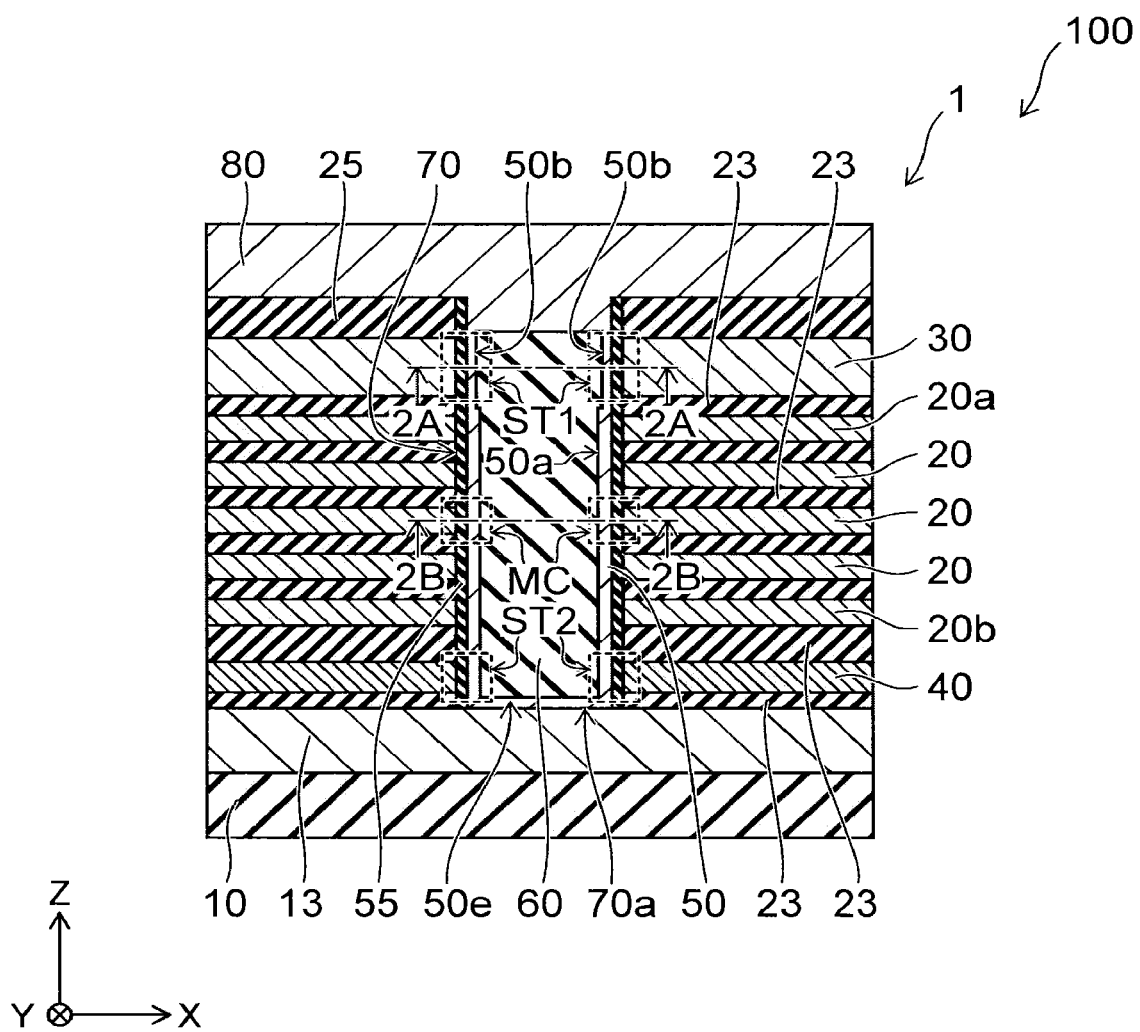
FIG. 1 is a schematic cross-sectional view illustrating an example of a non-volatile memory device according to a first embodiment.

According to an embodiment, a non-volatile memory device includes first electrodes stacked on an underlying layer, a second electrode provided on the first a electrodes, semiconductor layer extending in a first direction from the underlying layer to the second electrode, and a memory film provided between each of the first electrodes and the semiconductor layer. The semiconductor layer includes a first portion adjacent to the first electrodes and a second portion adjacent to the second electrode. The second portion has a thickness thinner than a thickness of the first portion in a second direction perpendicular to the first direction.

Embodiments will now be described with reference to the drawings. Like portions in the drawings are labeled with like reference numerals, with the detailed description thereof omitted appropriately, and the different portions are described. The drawings are schematic or conceptual. The relationship between the thickness and the width of each portion, and the size ratio between the portions, for example, are not necessarily identical to those in reality. Furthermore, the same portion may be shown with different dimensions or ratios in each figure.

In the following description, the arrangement of components is described with reference to three axis directions orthogonal to each other, i.e., the X-direction, Y-direction, and Z-direction, shown in the figures. The Z-direction may be referred to as "above", and the opposite direction may be referred to as "below".

First Embodiment

FIG. 1 is a schematic sectional view showing a non-volatile memory device 100 according to a first embodiment. FIG. 1 is a partial sectional view showing the structure of a memory cell array 1 of the non-volatile memory device 100.

The memory cell array 1 includes a plurality of first electrodes (hereinafter word lines 20), a second electrode (hereinafter select gate 30), and a third electrode (hereinafter select gate 40). The word lines 20 are stacked on an underlying layer 10. The select gate 30 is provided on the uppermost layer 20a of the word lines 20. A conductive layer (hereinafter source layer 13) is provided between the underlying layer 10 and the word lines 20. The select gate 40 is provided between the source layer 13 and the lowermost layer 20b of the plurality of word lines 20.

An insulating film 23 is provided between the word lines adjacent to each other in the Z-direction. The insulating film 23 is provided also between the word line 20 and the select gate 30, between the word line 20 and the select gate 40, and between the source layer 13 and the select gate 40. The insulating film 23 electrically insulates the word lines 20, the select gates 30, 40, and the source layer 13 from each other.

The memory cell array 1 further includes a semiconductor layer 50 and a memory film 55 extending in a first direction (Z-direction) from the underlying layer 10 toward the select gate 30. The semiconductor layer 50 is provided so as to pierce in the Z-direction through the select gate 40, the word lines 20, and the select gate 30. The memory film 55 is provided at least between each word line 20 and the semiconductor layer 50. The memory film 55 can extend between the semiconductor layer 50 and the select gate 30, and between the semiconductor layer 50 and the select gate 40.

Specifically, the memory film 55 is provided to cover the inner wall of a memory hole 70 piercing through the word lines 20 and the select gates 30 and 40. The semiconductor layer 50 is provided on the memory film 55, and covers the wall surface and the bottom surface 70a of the memory hole 70. The semiconductor layer 50 is electrically connected to the source layer 13 at the bottom surface 70a of the memory hole 70.

Furthermore, a core layer 60 is provided inside the memory hole 70. The core layer 60 is an insulator. The core layer 60 may be made of a material different from that of the insulating film 23, for example. The semiconductor layer 50 is provided between the core layer 60 and the word line 20. Furthermore, the semiconductor layer 50 is provided between the core layer 60 and the select gate 30 and between the core layer 60 and the select gate 40.

The memory cell array 1 includes a plurality of memory cells MC arranged in the Z-direction. The memory cell MC includes part of the memory film 55 and is provided between the word line 20 and the semiconductor layer 50. The memory cells MC are arranged in the extending direction of the semiconductor layer 50 (Z-direction). The number of memory cells provided inside a memory hole 70 is equal to the stacked number of the word lines 20.

The memory film 55 extends in the Z-direction. The memory film 55 is an electrical insulator, and serves as a gate 5 insulating film.

The memory cell array 1 includes select transistors ST1 and ST2. In the select transistor ST1, the semiconductor layer 50 serves as a channel, and the select gate 30 serves as a gate electrode. In the select transistor ST2, the semiconductor layer 50 serves as a channel, and the select gate 40 serves as a gate electrode.

The memory cell array 1 includes a wiring (hereinafter bit line 80) provided via an interlayer insulating film 25 on the select gate 30. The bit line 80 is electrically connected to the upper end of the semiconductor layer 50. The semiconductor layer 50 includes a portion 50e provided between the source layer 13 and the core layer 60 at the bottom surface 70a of the memory hole 70, and is electrically connected to the source layer 13.

The memory cell array 1 includes a memory string provided inside the memory hole 70. The memory string includes a pair of select transistors ST1, ST2 provided on the semiconductor layer 50 and a plurality of memory cells MC arranged between the select transistors ST1 and ST2. One end of the semiconductor layer 50 is electrically connected to the source layer 13, and the other end is electrically connected to the bit line 80.

The select gate 30 and the select gate 40 are provided to be thicker than each word line 20 in the Z-direction. This may reduce the off-current of the select transistors ST1 and ST2.

The semiconductor layer 50 includes a portion in which the memory cells MC are formed (hereinafter a memory channel portion 50a), and a portion in which the select gate 30 is formed (hereinafter a gate channel portion 50b). In other words, the semiconductor layer 50 includes a portion piercing through the word lines 20 (i.e. the memory channel portion 50a) and a portion piercing through the select gate 30 (i.e. the gate channel portion 50b). The thickness of the gate channel portion 50b is thinner than the thickness of the memory channel portion 50a. In other words, the thickness of the gate channel portion 50b is thinner than the thickness of the thinnest part of memory channel portion 50a. This may further suppress the off-current of the select transistor ST1, and improve the cutoff characteristic thereof.

Figure 2A:
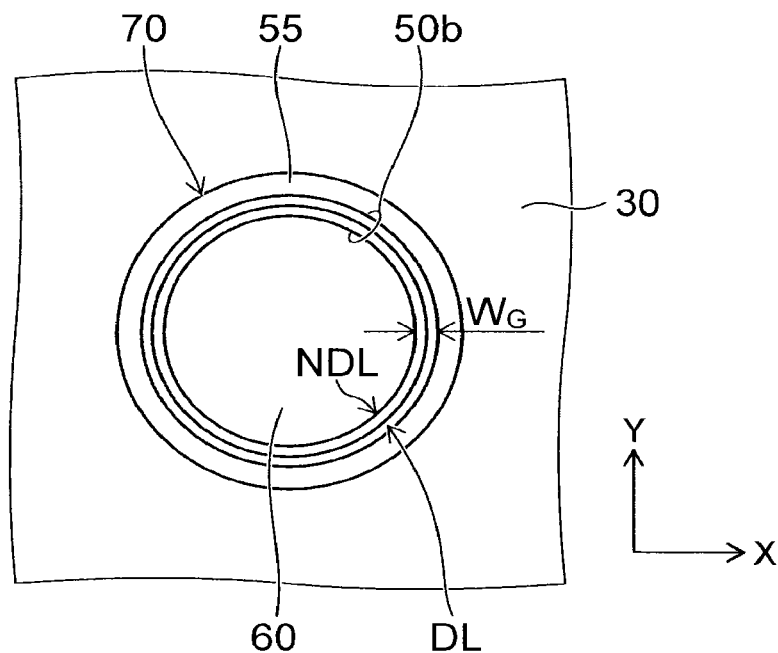
FIGS. 2A and 2B are schematic cross-sectional views illustrating an example of a memory hole in a memory cell array according to the first embodiment.
Figure 2B:
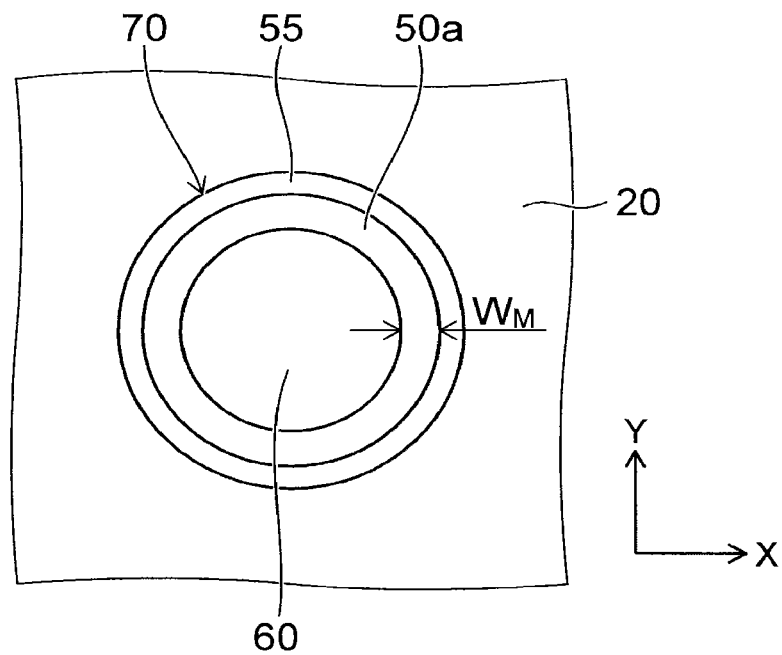

FIGS. 2A and 2B are schematic sectional views illustrating the memory hole 70 of the memory cell array 1 according to the first embodiment. FIG. 2A is a sectional view taken along line 2A-2A shown in FIG. 1. FIG. 2B is a sectional view taken along line 2B-2B shown in FIG. 1.

As shown in FIG. 2A, the memory hole 70 has e.g. a circular cross section in the X-Y plane. The memory film 55 and the gate channel portion 50b are stacked on the inner surface of the memory hole 70 piercing through the select gate 30. For example, a gate bias is applied to the gate channel portion 50b such that the select gate 30 is placed at a negative potential. Then, a depletion layer DL is formed inside the gate channel portion 50b. At this time, the select transistor ST1 is turned off, and blocks electrical continuity between the bit line 80 and the semiconductor layer 50 on the memory cell MC side.

For example, the number of carrier trap levels included in the gate channel portion 50b can be decreased by narrowing the width $W_G$ of the gate channel portion 50b. This can reduce the channel leakage current flowing via the trap levels. Furthermore, the width of the non-depleted region NDL can be narrowed by narrowing the width of the gate channel portion 50b. This also contributes to the reduction of the channel leakage current. As a result, by narrowing the width $W_G$ of the gate channel portion 50b, the channel leakage current of the select transistor ST1 can be reduced, and its cutoff characteristics can be improved.

As shown in FIG. 2B, the memory film 55 and the memory channel portion 50a are stacked on the inner surface of the memory hole 70 penetrating through the word line 20. The width $W_M$ of the memory channel portion 50a is wider than the width $W_G$ of the gate channel portion 50b. This can decrease the resistance of the semiconductor layer 50 and increase the current flowing in the memory channel portion 50a. That is, in this embodiment, the cutoff characteristics of the select transistor ST1 can be improved while maintaining the current flowing in the memory channel portion 50a. This can prevent e.g. data misread.

Next, a method for manufacturing the non-volatile memory device 100 according to the first embodiment is described with reference to FIGS. 3A to 10. FIGS. 3A to 10 are schematic sectional views showing an example of the process for manufacturing the memory cell array 1.

Figure 3A:
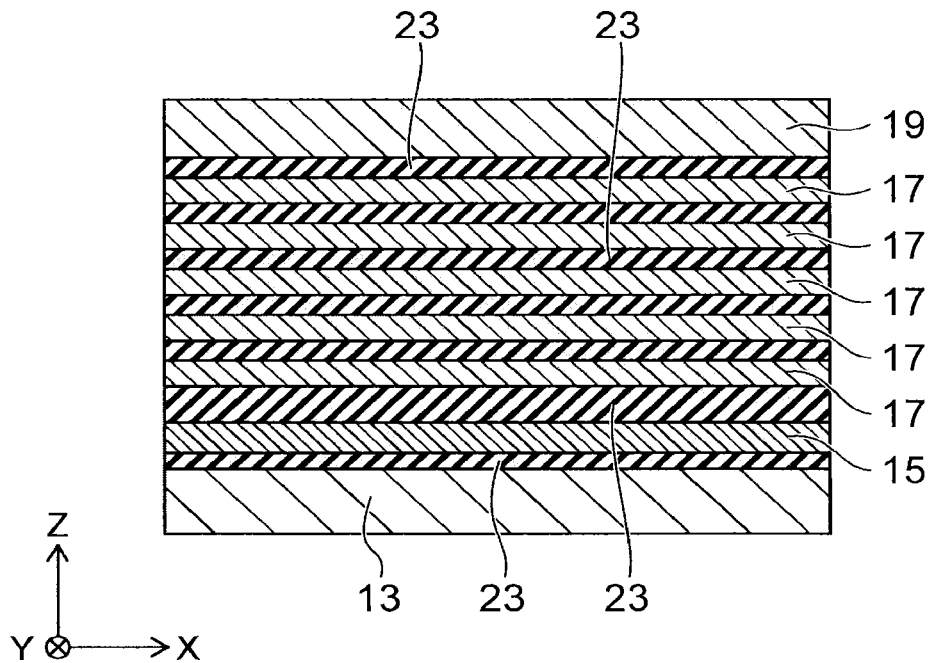
FIGS. 3A to 10 are schematic cross-sectional views illustrating an example of a manufacturing process of the memory cell array according to the first embodiment.

As shown in FIG. 3A, an insulating film 23 and a conductive layer 15 are formed in this order on a source layer 13. Conductive layers 17 and insulating films 23 are alternately stacked on the conductive layer 15. The number of stacked conductive layers 17 is equal to the number of memory cells MC arranged in the Z-direction. A conductive layer 19 is formed on the uppermost insulating film 23. As a result, the plurality of conductive layers 17 are stacked in the Z-direction via the insulating films 23.

The source layer 13 is formed on an underlying layer 10, not shown. The underlying layer is e.g. an interlayer insulating film formed on a wafer. The source layer 13 may be formed in an insulating substrate. In this case, the underlying layer 10 is the insulating substrate. The conductive layers 15, 17, and 19 are e.g. conductive polycrystalline silicon (polysilicon) films. The insulating film 23 is e.g. a silicon oxide film. The source layer 13 may be formed by diffusing impurity and the like in a semiconductor substrate.

Figure 3B:
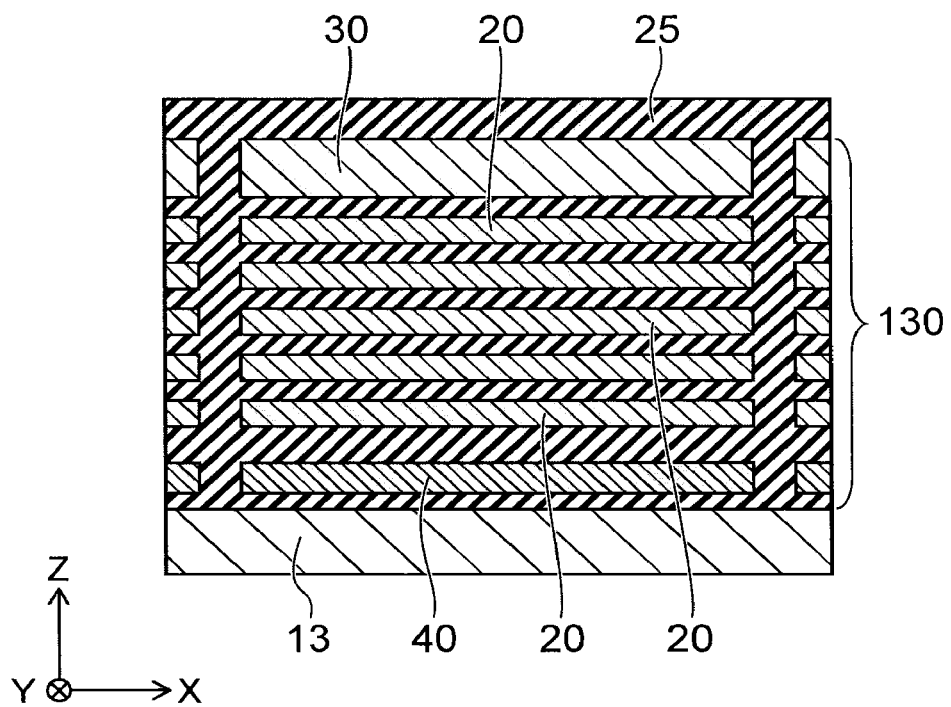
Figure 11:
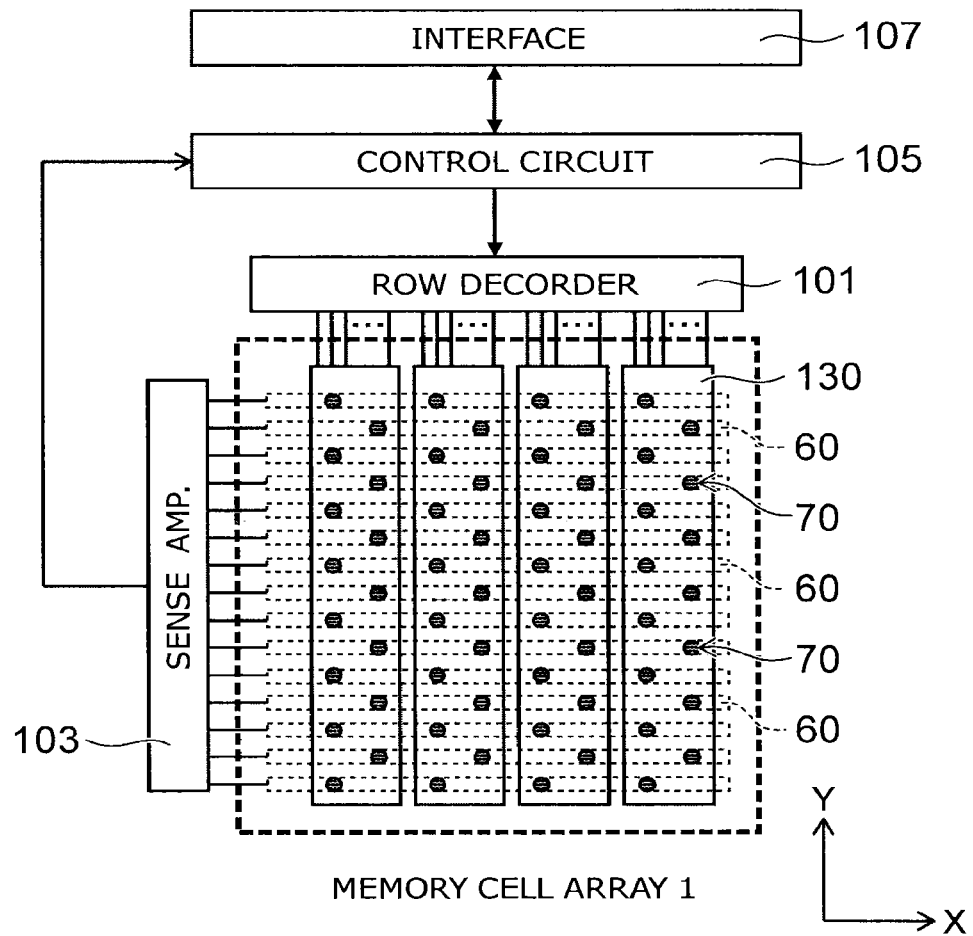
FIG. 11 is a block diagram illustrating an example of the non-volatile memory device according to the first embodiment.

Next, the conductive layers 15, 17, and 19 are patterned into stripes extending in the Y-direction to form a plurality of stacked bodies 130 (see FIG. 11). As a result, the conductive layers 15, 17, and 19 can be processed to form a select gate 40, word lines 20, and a select gate 30. Next, as shown in FIG. 3B, an interlayer insulating film 25 is formed so as to cover the stacked bodies 130. As a result, the interlayer insulating film covers the select gate 40, the word lines 20, and the select gate 30. The interlayer insulating film 25 is e.g. a silicon oxide film.

In this specification, "to cover" is not limited to the case where "what covers" is in direct contact with "what is covered", but also includes the case where "what covers" covers "what is covered" via another element.

Figure 4A:
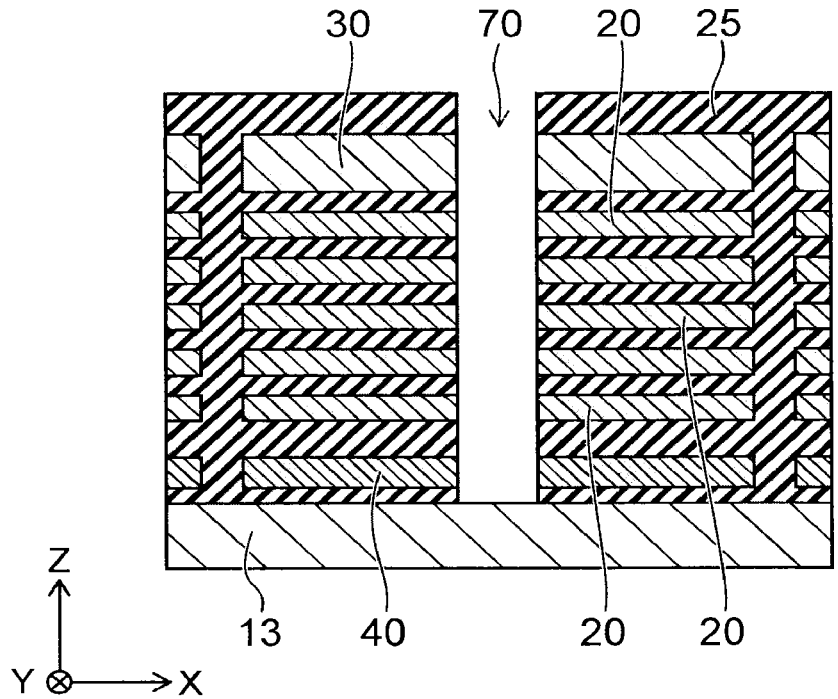

As shown in FIG. 4A, a memory hole 70 is formed. For example, a through hole extending from the upper surface of the interlayer insulating film 25 to the source layer 13 is formed by RIE (reactive ion etching). For example, the memory hole 70 pierces in the Z-direction through the select gate 40, the plurality of word lines 20, and the select gate 30.

Figure 4B:
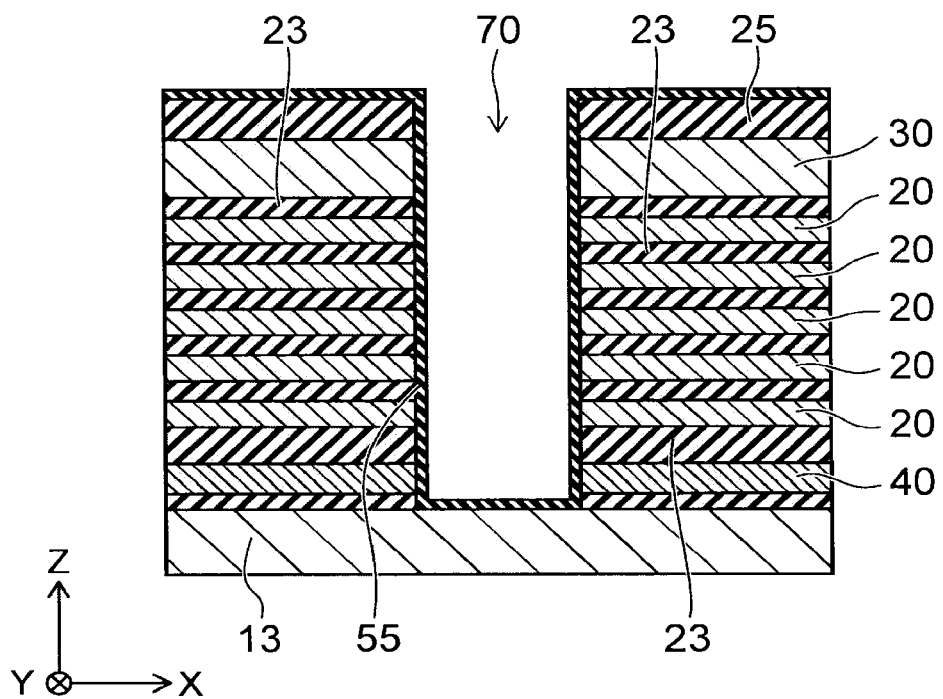

As shown in FIG. 4B, a memory film 55 covering the inner wall of the memory hole 70 is formed. The memory film 55 is e.g. a stacked film including a silicon oxide film and a silicon nitride film. For example, a silicon oxide film covering the inner surface of the memory hole 70 and the upper surface of the interlayer insulating film 25 is formed by CVD (chemical vapor deposition). Next, a silicon nitride film is formed on the silicon oxide film. Furthermore, another silicon oxide film is formed on the silicon nitride film. The memory film 55 has e.g. a three-layer structure of silicon oxide film/silicon nitride film/silicon oxide film. The memory film 55 is formed conformally on the inner wall of the memory hole 70.

Figure 5A:
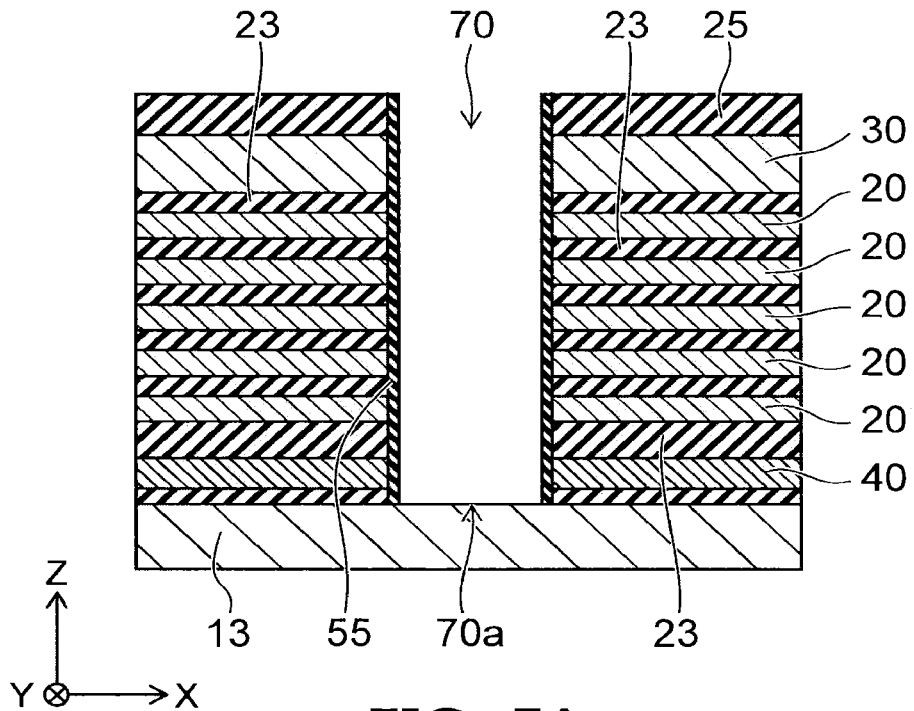

As shown in FIG. 5A, the memory film 55 formed on the bottom surface 70a of the memory hole 70 is selectively removed. For example, the memory film 55 formed on the bottom surface 70a is selectively removed by anisotropic RIE, and the portion formed on the wall surface of the memory hole 70 is left. As a result, the source layer 13 is exposed from the bottom surface 70a of the memory hole 70. The memory film 55 formed on the upper surface of the interlayer insulating film 25 is also removed.

Figure 5B:
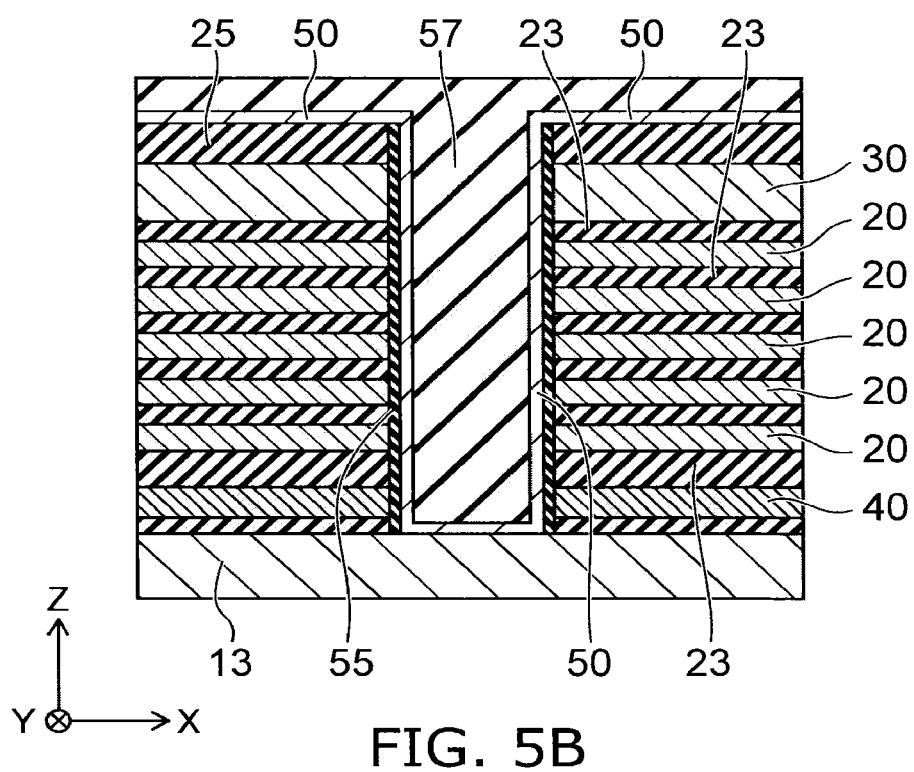

As shown in FIG. 5B, a semiconductor layer 50 covering the inner surface of the memory hole 70 and the interlayer insulating film 25 is formed. The semiconductor layer 50 is e.g. a polysilicon layer formed by CVD. The semiconductor layer 50 includes e.g. n-type impurity. The semiconductor layer 50 is in contact with the source layer 13 exposed at the bottom surface 70a of the memory hole 70. As a result, the semiconductor layer 50 is electrically connected to the source layer 13.

Next, an insulating film 57 filling the inside of the memory hole 70 is formed. The insulating film 57 is formed also on the interlayer insulating film 25. The insulating film 57 is preferably made of e.g. a material that can be selectively removed relative to the select gate 30, the word line 20, the insulating film 23, and the interlayer insulating film 25. The insulating film 57 is e.g. a silicon nitride film.

Figure 6A:
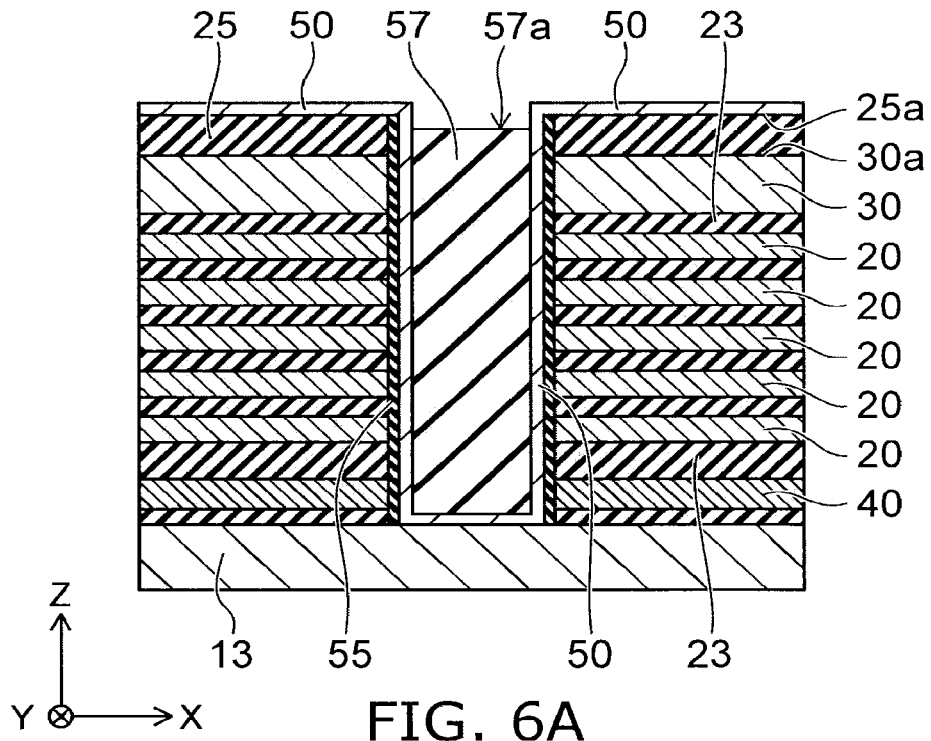

As shown in FIG. 6A, the insulating film 57 is etched back to expose the semiconductor layer 50 formed on the interlayer insulating film 25. The insulating film 57 is left inside the memory hole 70. The upper surface 57a of the insulating film 57 is located above the upper surface of the select gate 30. The upper surface 57a of the insulating film 57 can be located between the upper surface 30a of the select gate 30 and the upper surface 25a of the interlayer insulating film 25.

Figure 6B:
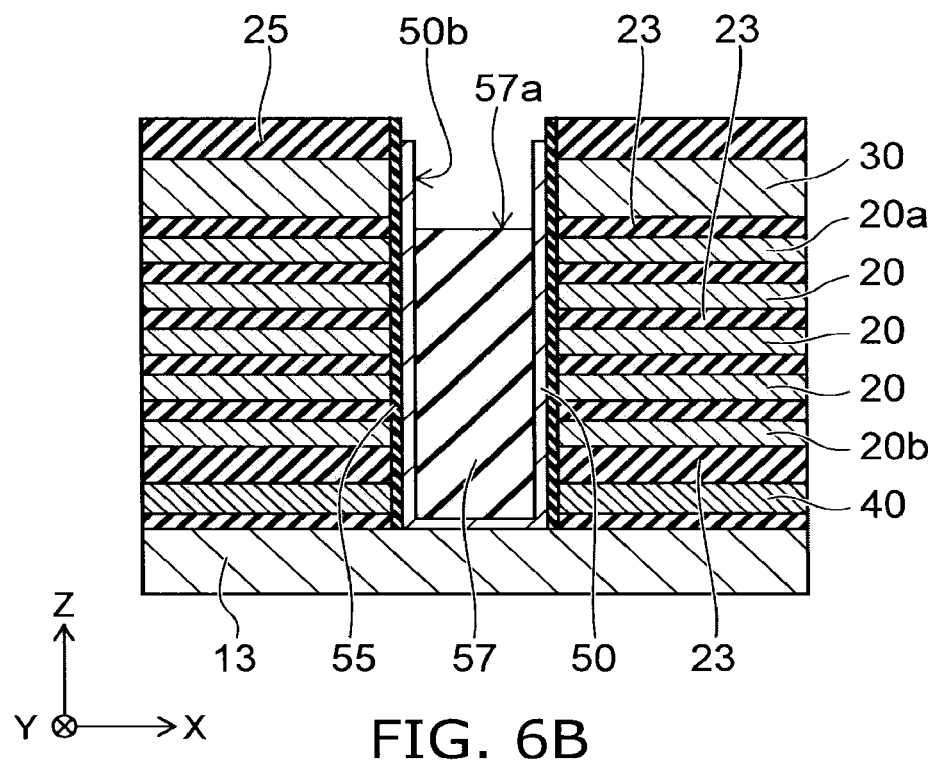

As shown in FIG. 6B, the semiconductor layer 50 exposed above the insulating film 57 is removed by etching. Subsequently, the insulating film 57 is further etched back to make the upper surface 57a of the insulating film 57 lower than the lower surface of the select gate 30. At this time, the upper surface 57a of the insulating film 57 can be located between the select gate 30 and the uppermost layer 20a of the word lines 20. As a result, the gate channel portion 50b is exposed, which faces the select gates 30 across the memory film 55. In the following description, the insulating film 57 left inside the memory hole 70 is referred to as a core layer 60.

Figure 7:
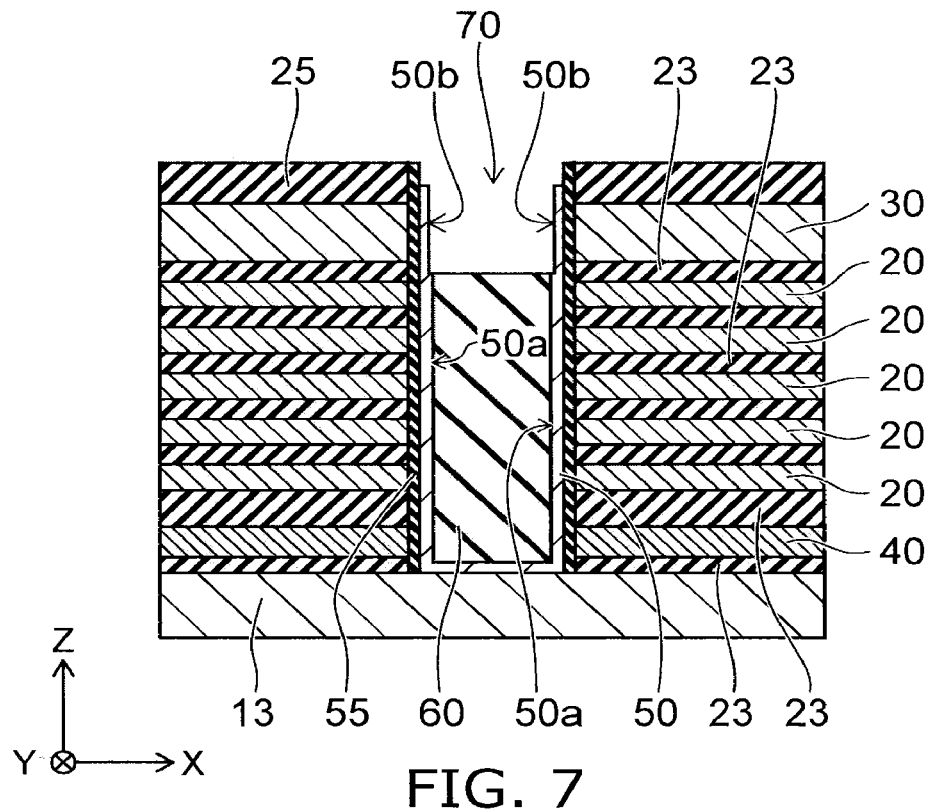

As shown in FIG. 7, the gate channel portion 50b exposed at the wall surface of the memory hole 70 is etched, and thinned. For example, the gate channel portion 50b is thermally oxidized to form a silicon oxide film on the surface. Subsequently, the silicon oxide film is selectively removed with e.g. an etching liquid based on hydrofluoric acid. Thus, the film thickness of the gate channel portion 50b is made thinner than that of the memory channel portion 50a. The thinning method of the gate channel portion 50b is not limited to the one based on thermal oxidation, but an isotropic dry etching may be used therefor. The thermal oxidation may be repeatedly performed.

The memory channel portion 50a is a portion located between the core layer 60 and each word line 20. For example, the gate channel portion 50b is formed to be thinner than any part of the memory channel portion 50a in the X-direction.

Figure 8:
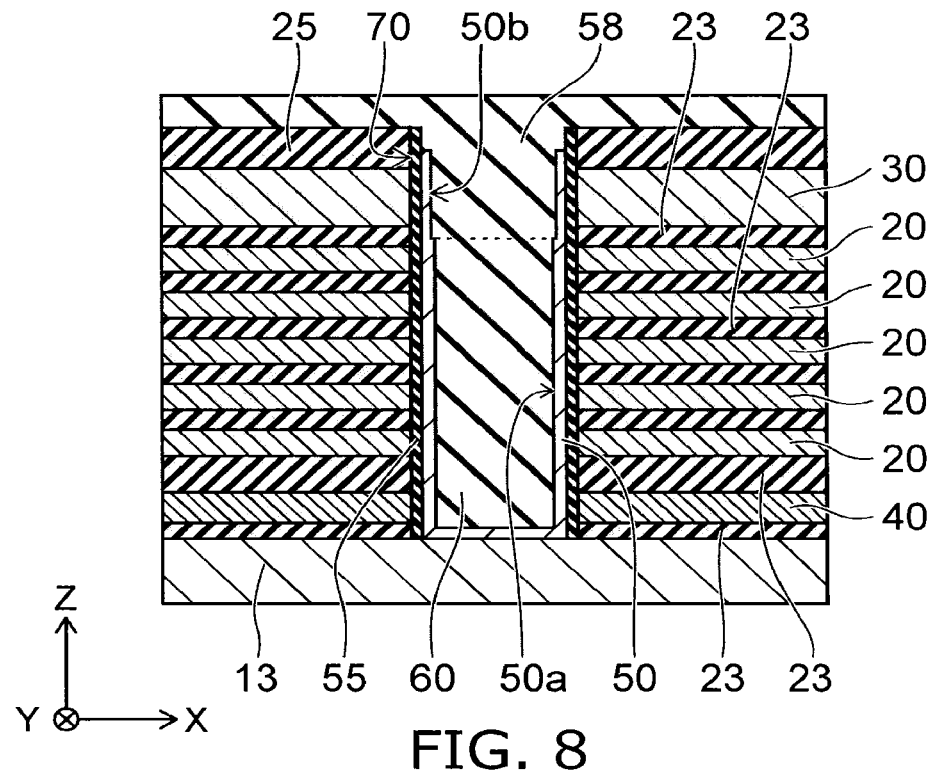

As shown in FIG. 8, an insulating film 58 is formed to fill the upper part of the memory hole 70. The insulating film 58 is formed also on the interlayer insulating film 25. The insulating film 58 is made of a material that can be selectively etched against the interlayer insulating film 25. The insulating film 58 is e.g. a silicon nitride film. In the case where the insulating film 58 is made of the same material as the core layer 60, for example, the insulating film 58 is integrated with the core layer 60.

Figure 9:
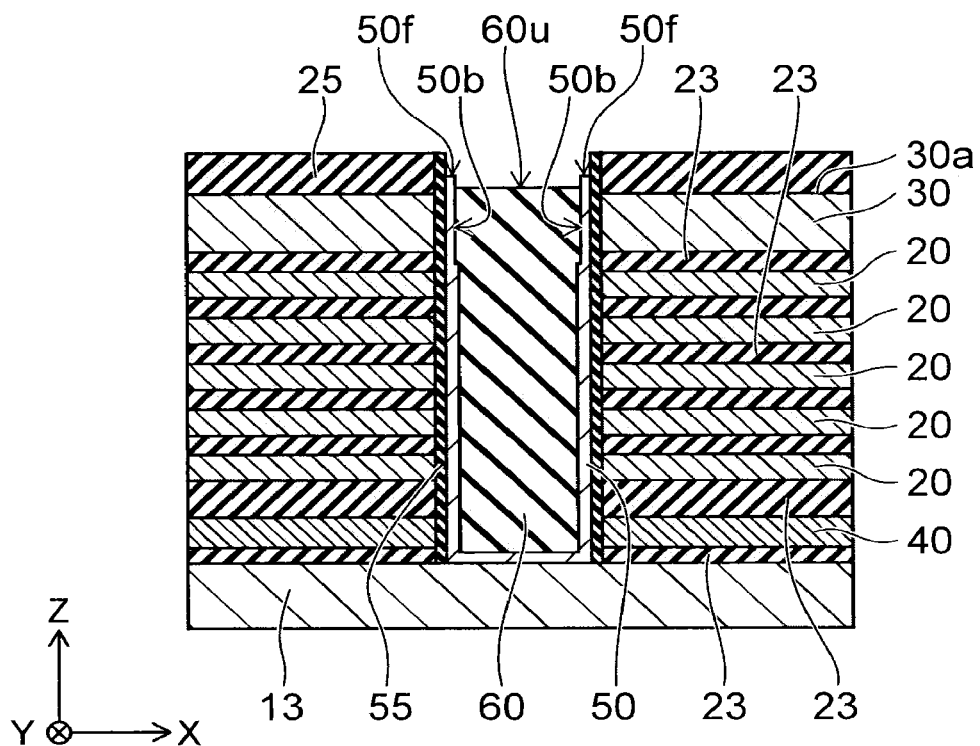

As shown in FIG. 9, the insulating film 58 (core layer 60) is etched back to make the upper surface 60u of the core layer 60 lower than the upper end 50f of the semiconductor layer 50. For example, the upper surface 60u of the core layer 60 is located between the upper surface 30a of the select gate 30 and the upper end 50f of the semiconductor layer 50 in the Z-direction. As a result, the upper end 50f of the semiconductor layer 50 is exposed from the core layer 60.

Figure 10:
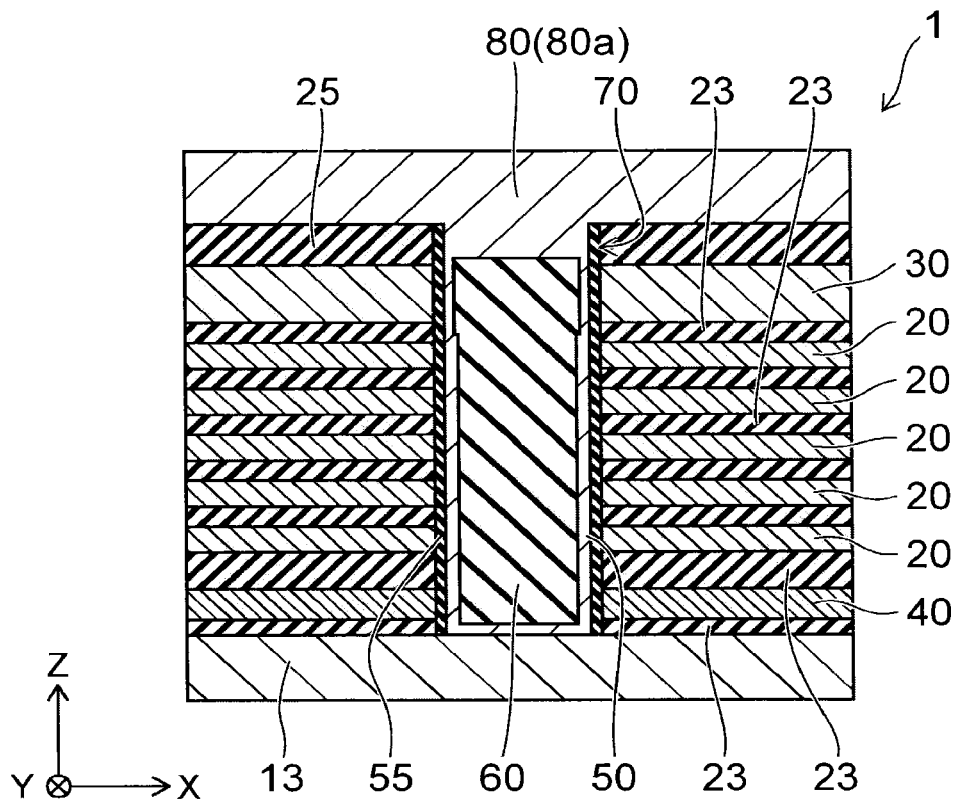

As shown in FIG. 10, a conductive film 80a is formed on the interlayer insulating film 25. Subsequently, the conductive film 80 is separated into wirings (see FIG. 11) extending in the X-direction to form bit lines 80. Thus, a memory cell array 1 is completed. The bit line 80 includes e.g. a portion extending inside the memory hole 70 and being in contact with the upper end 50f of the semiconductor layer 50. The bit line 80 is e.g. a polysilicon film doped with p-type impurity.

FIG. 11 is a block diagram showing an example of the non-volatile memory device 100 according to the first embodiment. The non-volatile memory device 100 includes e.g. a memory cell array 1, a row decoder 101, a sense amplifier 103, a control circuit 105, and an interface 107. The control circuit 105 controls the row decoder 101 and the sense amplifier 103 to record data in the memory cells MC and to read the data from the memory cells MC based on the instruction obtained from outside through the interface 107.

As shown in FIG. 11, the memory cell array 1 includes a plurality of stacked bodies 130. Each stacked body 130 includes lines 20 and select gates 30, 40. As viewed in the Z-direction, the stacked body 130 is provided in e.g. a rectangular shape extending in the Y-direction. The stacked bodies 130 are arranged in the X-direction. Each stacked body 130 includes memory holes 70.

The row decoder 101 is connected to each of word line 20, the select gate 30, and the select gate 40, and applies voltages thereto. The sense amplifier 103 is connected to the bit lines 80 and the source layer 13. The sense amplifier 103 applies a voltage between the source layer 13 and the bit line 80 and detects the current flowing therebetween. Thus, the sense amplifier 103 reads the data from the memory cell. Furthermore, the sense amplifier 103 determines the data read from the memory cell MC and temporarily store the data.

The bit line 80 extends in e.g. the X-direction and is electrically connected to a semiconductor layer provided in one of the memory holes in each stacked body 130. The control circuit 105 may access one memory cell MC by selecting one word line 20 through the row decoder 101 and selecting one bit line 80 through the sense amplifier 103.

Next, the operation of the memory cell array 1 is described with reference to Table 1. Table 1 shows the voltages applied to each of the bit line BL, the select gates SGD, SGS, the word lines WL, and the source layer SL, and their relations to the operation mode. Here, the select gate SGD corresponds to the select gate 30, and the select gate SGS corresponds to the select gate 40.

TABLE 1

|     | Read  | Write "0" | Write "1" | Erase(selected) | Erase(non-selected) |
|-----|-------|-----------|-----------|-----------------|---------------------|
| BL  | Vbl   | 0         | Vdd       | Verase          | Verase              |
| SGD | Vdd   | Vdd       | Vdd       | Vera del        | Vera del            |
| WL4 | Vread | Vpass     | Vpass     | 0               | open                |
| WL3 | 0     | Vprog     | Vprog     | 0               | open                |
| WL2 | Vread | Vpass     | Vpass     | 0               | open                |
| WL1 | Vread | Vpass     | Vpass     | 0               | open                |
| SGS | Vdd   | Voff      | Voff      | Vera del        | Vera del            |
| SL  | 0     | Vdd       | Vdd       | open            | open                |

(Read Operation)

For example, a voltage of 0.7 V is applied to the selected bit line BL, and a voltage of 0 V is applied to the source layer SL at the time of reading data from the selected memory cell MC1. A voltage of Vdd (e.g., 3.0 V) is applied to the select gates SGD and SGS in the stacked body 130 that includes the selected memory cell MC1, and turns on the select transistors ST1 and ST2. The select transistors ST1 and ST2 in the other stacked bodies 130 are maintained in the off-state.

Next, the word line WL including the selected memory cell MC1 is set to 0 V, and Vread (e.g., 4.5 V) is applied to the other word lines WL. Thus, a current corresponding to the threshold voltage Vth of the selected memory cell MC1 flows between the bit line BL and the source layer SL. The sense amplifier 103 may read data stored in the selected memory cell MC by detecting this current.

(Write Operation)

In the case of writing data "0" in the memory cell MC1, for example, electrons are injected into the memory film 55 of the selected memory cell MC1, and increase the threshold voltage thereof, i.e. the injected electrons shift the threshold value to the positive direction. In this case, the voltage of 0V is applied to the selected bit line BL; Vdd (e.g., 3.0 V) is applied to the source layer SL and the select gate SGD in the stacked body 130 that includes the selected memory cell MC1; and Voff (e.g., 0 V) is applied to the select gate SGS. Thus, the select transistor ST1 is turned on, and the select transistor ST2 is turned off. The semiconductor layer 50 is biased at equipotential (0 V) to the bit line BL.

Here, the bit line BL is biased at 0 V, and the gate electrode of the select transistor ST1 is biased at Vdd. On the other hand, the source layer SL is biased Vdd, and the gate electrode of the select transistor ST2 is biased at 0 V. Thus, it is preferable that the select transistor ST1 have smaller off leakage than the select transistor ST2. Accordingly, it is preferable to reduce the channel leak current in the select transistor ST1 by narrowing the width $W_G$ of the gate channel portion 50b.

On the other hand, in the read operation, a large current may be passed in the memory string. In this case, the width of the channel portion is preferably wider in the select transistor ST2. Thus, the characteristics can be improved at the read time by making the width of the channel portion of the select transistor ST2 wider than the width $W_G$ of the gate channel portion 50b.

The word line WL that includes the selected memory cell MC1 is biased at Vprog (e.g., 18 V), and the other word lines WL are biased at Vpass (e.g., 10 V). Thus, electrons are injected from the semiconductor layer 50 into the memory film 55 in the selected memory cell MC1. Accordingly, the threshold voltage of the selected memory cell MC1 is shifted to the positive direction.

In the case of writing data "1" in the memory cell MC1, for example, the threshold of the memory cell MC1 is maintained at the level of the erase time, i.e. no electron is injected into the charge stored layer. In this case, the selected bit line BL is biased at Vdd. This makes the gate potential of the select transistor ST1 equal to the source potential thereof. Thus, the select transistor ST1 is turned off. As a result, the potential difference decreases between the memory channel portion 50a and the word line WL in the memory cell MC1. Thus, no injection of electron into the memory film 55 occurs in the memory cell MC1.

(Erase Operation)

The data erase operation is performed in units of memory blocks each including a plurality of memory strings. For example, the bit line is biased at Verase (e.g. 20 V), and the source layer SL is held at a floating voltage. Next, the potential of the select gates SGS and SGD is increased to Verase_del (e.g. 15 V), for example. This generates a GIDL current (gate induced drain leak current) near the gate end of the select transistor ST1, and holes generated therein move to the memory channel portion 50a. Thus, the potential of the memory channel portion 50a comes closer to Verase. Next, the potential of all the word lines WL in the selected memory block is set to e.g. 0 V. Then, electrons are extracted from the memory film 55. This erases the data stored in the memory cells MC in the memory block.

During this time, the potential of all the word lines WL in the non-selected memory block is held at a floating voltage. Since the word line WL is capacitively coupled to the memory channel portion 50a, the potential of the word lines WL increases as the potential increases in the memory channel portion 50a. As a result, the potential difference between the word line WL and the memory channel portion 50a comes closer to 0. Thus, no electrons are extracted from the memory film 55. That is, the data is not erased in the memory cells MC.

The control circuit 105 receives the instruction from outside through the interface 107, and provides commands based thereon to the row decoder 101 and the sense amplifier 103 for implementing the aforementioned operations.

Figure 12:
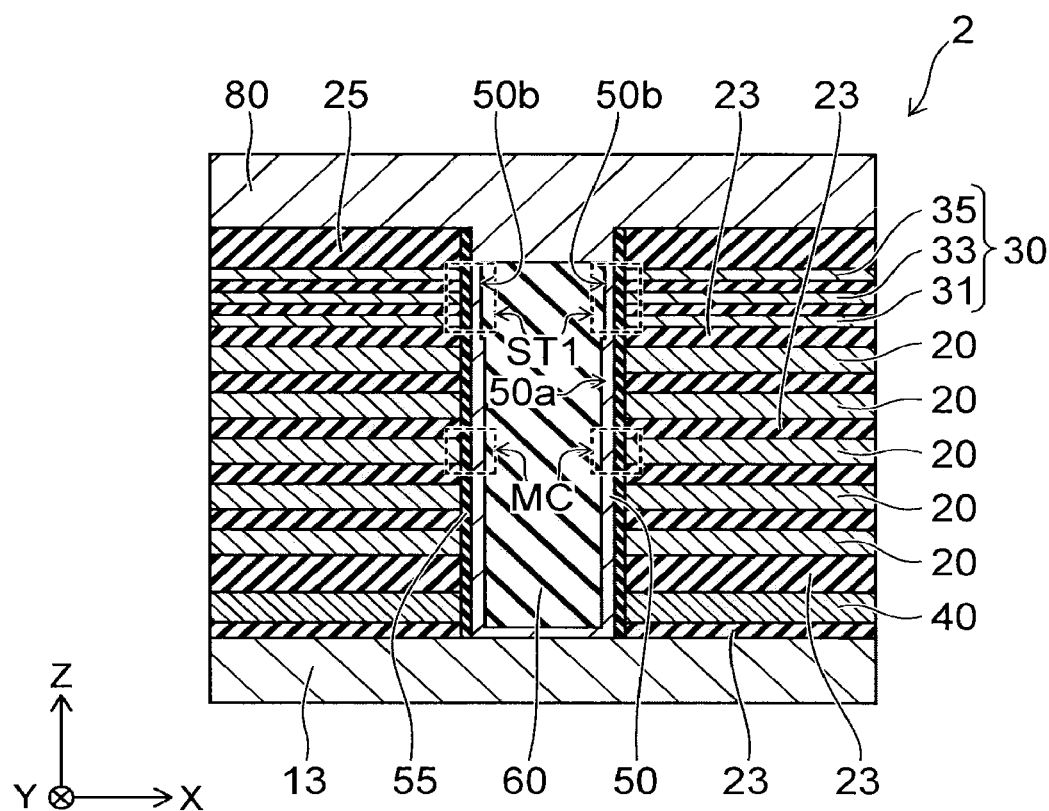
FIG. 12 is a schematic cross-sectional view illustrating an example of a memory cell array according to a variation of the first embodiment.

FIG. 12 is a schematic sectional view showing a memory cell array 2 according to a variation of the first embodiment.

The select gate 30 of the memory cell array 2 includes a plurality of sublayers 31, 33, and 35 stacked sequentially in the Z-direction. The number of sublayers included in the select gate 30 is not limited to this example, but may be e.g. two, or four or more.

An insulating film 23 is formed between the sublayer 31 and the sublayer 33 and between the sublayer 33 and the sublayer 35. The insulating film 23 is, for example, a silicon oxide film. The sublayers 31, 33, and 35 are electrically connected to each other in a portion not shown, for example.

The semiconductor layer 50 includes a gate channel portion 50b in contact with the sublayers 31, 33, and 35 via the memory film 55. In other words, the semiconductor layer 50 includes a gate channel portion 50b opposed to the sublayers 31, 33, and 35 across the memory film 55.

The thickness of the gate channel portion 50b in the direction orthogonal to the Z-direction is thinner than e.g. the thickness of the memory channel portion 50a in the direction orthogonal to the Z-direction. The gate channel portion 50b may have a portion thinner than any part of the memory channel portion 50a, in which the semiconductor layer 50 pierces through any one of the sublayers 31, 33, and 35.

Also in the memory cell array 2, the channel leakage current of the select transistor ST1 may also be suppressed to improve its cutoff characteristics while maintaining the value of the current flowing in the memory channel portion 50a. This may suppress an access failure to the memory cell MC.

Second Embodiment

Figure 13:
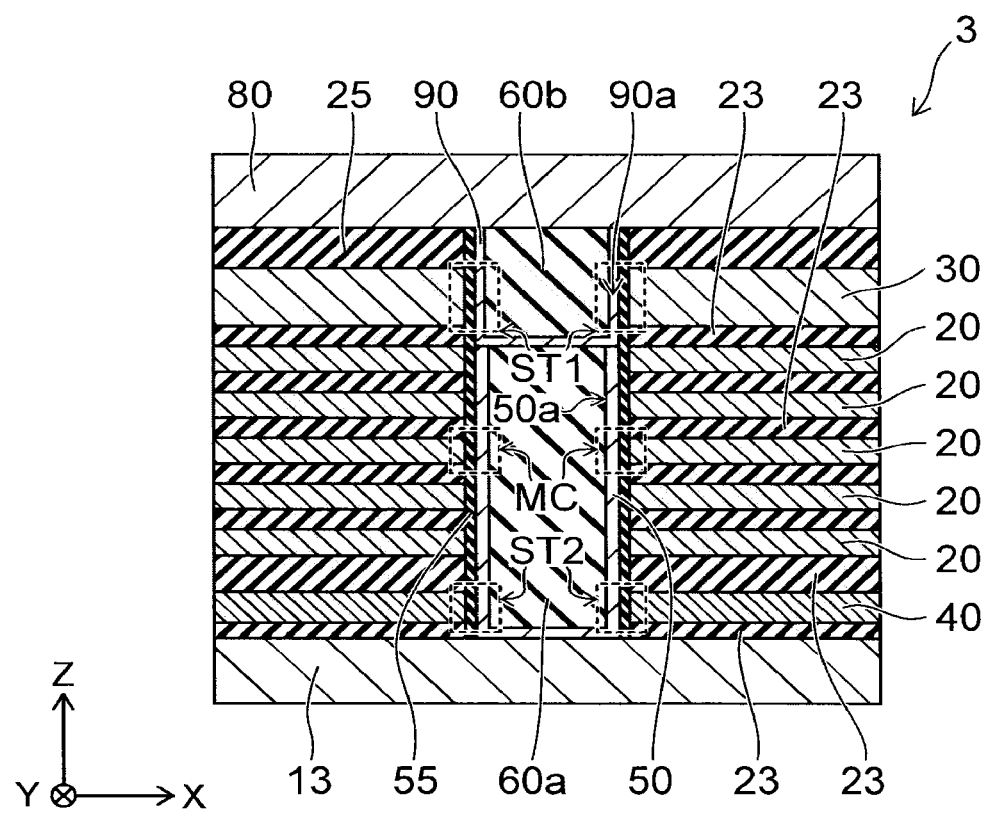
FIG. 13 is a schematic cross-sectional view illustrating an example of a memory cell array according to a second embodiment.

FIG. 13 is a schematic sectional view showing a memory cell array 3 according to a second embodiment.

The memory cell array 3 includes a plurality of word lines 20, a select gate 30, and a select gate 40. The word lines 20 are stacked on an underlying layer 10 (not shown). The select gate 30 is provided on the uppermost layer 20a of the word lines 20. A conductive layer (hereinafter source layer 13) is provided between the underlying layer 10 and the word lines 20. The select gate 40 is provided between the source layer 13 and the lowermost layer 20b of the word lines 20. The source layer 13, the word lines 20, and the select gates 30 and 40 are electrically insulated from each other via an insulating film 23.

The memory cell array 3 further includes a semiconductor layer 50 and a memory film 55 extending in the Z-direction. The semiconductor layer 50 extends in the Z-direction so as to pierce through the select gate 40, the plurality of word lines 20, and the insulating film 23. The memory film 55 is provided at least between each of the word lines 20 and the semiconductor layer 50. The memory film 55 may extend between the select gate 40 and the semiconductor layer 50.

The memory cell array 3 further includes a second semiconductor layer (hereinafter semiconductor layer 90) extending in the Z-direction so as to pierce through the select gate 30. The semiconductor layer 90 is electrically connected to the semiconductor layer 50. For example, the semiconductor layer 90 is made of a material in which a density of carrier trap level is lower than that in the semiconductor layer 50. The semiconductor layer 90 is, for example, an oxide semiconductor. For example, the semiconductor layer 90 is provided so that the thickness thereof in the direction orthogonal to the Z-direction is smaller than the thickness of the semiconductor layer 50 in the direction orthogonal to the Z-direction.

For example, the memory film 55 is provided to cover the inner wall of a memory hole 70 piercing through the word lines 20, the insulating film 23, and the select gates 30 and 40. The semiconductor layer 50 is provided to cover the bottom surface 70a of the memory hole 70 and the lower part of the memory film 55. The semiconductor layer 50 is in contact with the source layer 13 in the portion 50e covering the bottom surface 70a of the memory hole 70, and electrically connected to the source layer 13. The semiconductor layer 90 covers the upper part of the memory film 55. The semiconductor layer 90 is electrically connected to the bit line 80. The bit line 80 is provided on the select gate 30 via an interlayer insulating film 25.

A core layer 60a and a core layer 60b are provided inside the memory hole 70. The core layers 60a and 60b are insulators. The core layers 60a and 60b may be different in material from the insulating film 23, for example. The semiconductor layer 50 is provided between the core layer 60a and the word line 20. Furthermore, the semiconductor layer 50 is provided between the core layer 60a and the select gate 40. The semiconductor layer 90 is provided between the core layer 60b and the select gate 30. Furthermore, the semiconductor layer 90 may include a portion provided between the core layer 60a and the core layer 60b.

The memory film 55 is provided between each word line 20 and the semiconductor layer 50. The memory film 55 may extend between the semiconductor layer 50 and the select gate 40. Furthermore, the memory film 55 may extend between the semiconductor layer 90 and the select gate 30.

The memory cell array 3 includes a plurality of memory cells MC arranged in the Z-direction, a select transistor ST1, and a select transistor ST2. The select transistors ST1 and ST2 are disposed on both sides of the memory cells MC arranged in the Z-direction. The memory cell MC includes part of the memory film 55 and is located between the word line 20 and the semiconductor layer 50. In the select transistor ST1, the portion of the semiconductor layer 90 piercing through the select gate 30 serves as a channel portion (hereinafter gate channel portion 90a), and the select gate 30 serves as a gate electrode. In the select transistor ST2, the portion of the semiconductor layer 50 piercing through the select gate 40 serves as a channel portion, and the select gate 40 serves as a gate electrode. The memory film 55 acts as a gate insulating film of the select transistors ST1 and ST2.

Next, a method for manufacturing the memory cell array 3 according to the second embodiment is described with reference to FIGS. 14A to 16B. FIGS. 14A to 16B are schematic sectional views showing the manufacturing process of the memory cell array 3.

Figure 14A:
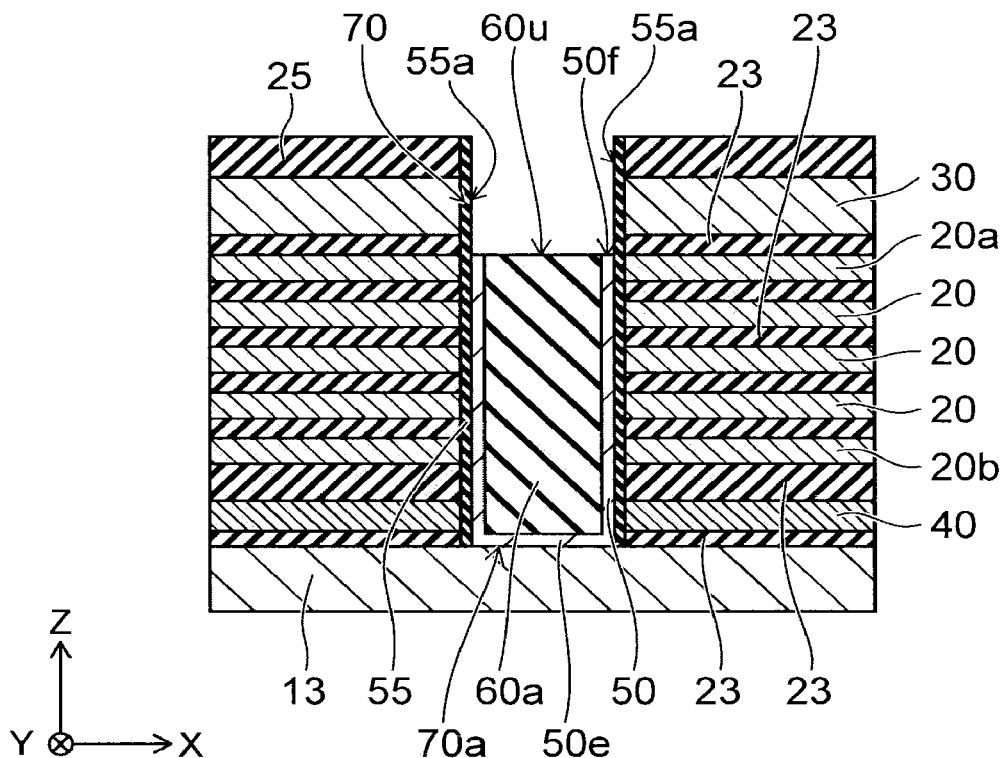
FIGS. 14A to 16B are schematic cross-sectional views illustrating an example of a manufacturing process of the memory cell array according to the second embodiment.

As shown in FIG. 14A, a semiconductor layer 50, a memory film 55, and a core layer 60a are formed inside a memory hole 70. The memory film 55 covers the inner wall of the memory hole 70. The semiconductor layer 50 is formed to cover the memory film 55 and a source layer 13 exposed at the bottom surface 70a of the memory hole 70. The core layer 60a is provided on the semiconductor layer 50 and fills the memory hole 70.

As shown in FIG. 14A, the upper surface 60u of the core layer 60a and the upper end 50f of the semiconductor layer 50 are located between the uppermost layer 20u of the word lines 20 and the select gate 30 in the Z-direction. Such a structure can be formed by removing the gate channel portion 50b exposed from the core layer 60a in the step shown in FIG. 7, for example.

Figure 14B:
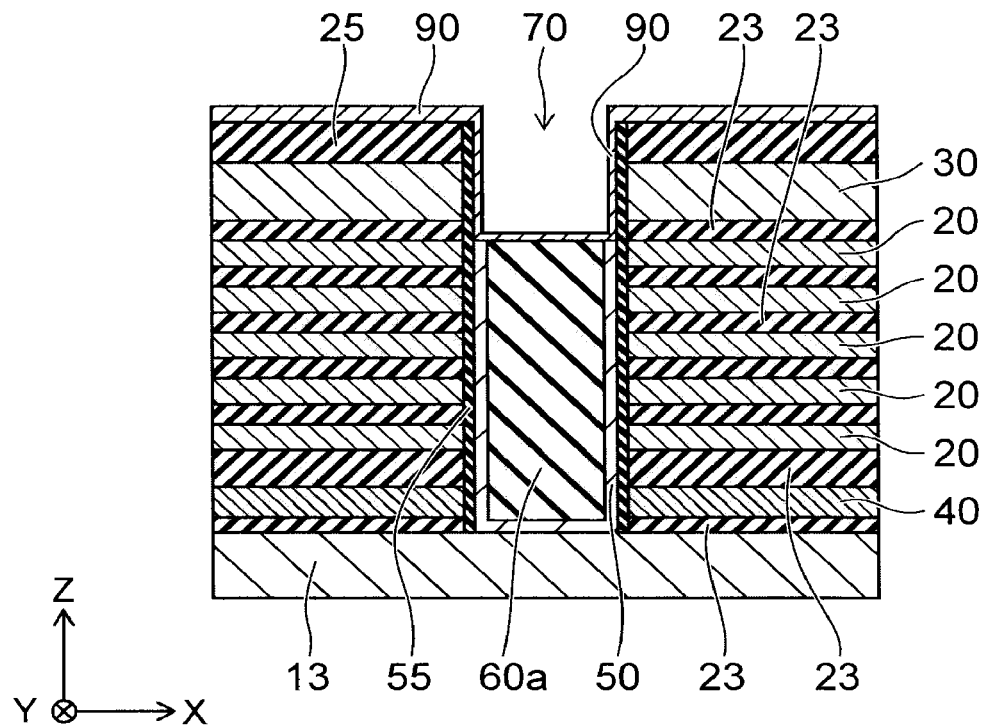

As shown in FIG. 14B, a semiconductor layer 90 is formed so as to cover the inner surface of the memory hole 70 and the upper surface of the interlayer insulating film 25. The semiconductor layer 90 is provided on the upper surface 60u of the core layer 60a, the upper end 50f of the semiconductor layer 50, and the portion 55a of the memory film 55 which covers the select gate 30 inside the memory hole 70.

The semiconductor layer 90 is, for example, an oxide semiconductor, and may be formed by reactive sputtering. Alternatively, the semiconductor layer 90 may be a polysilicon layer. The semiconductor layer 90 is made of IGZO (indium gallium zinc oxide), for example. For example, the semiconductor layer 90 may have a lower electron trap level density than the semiconductor layer 50 of polysilicon. The semiconductor layer 90 is preferably formed to be thinner than the semiconductor layer 50.

Figure 15A:
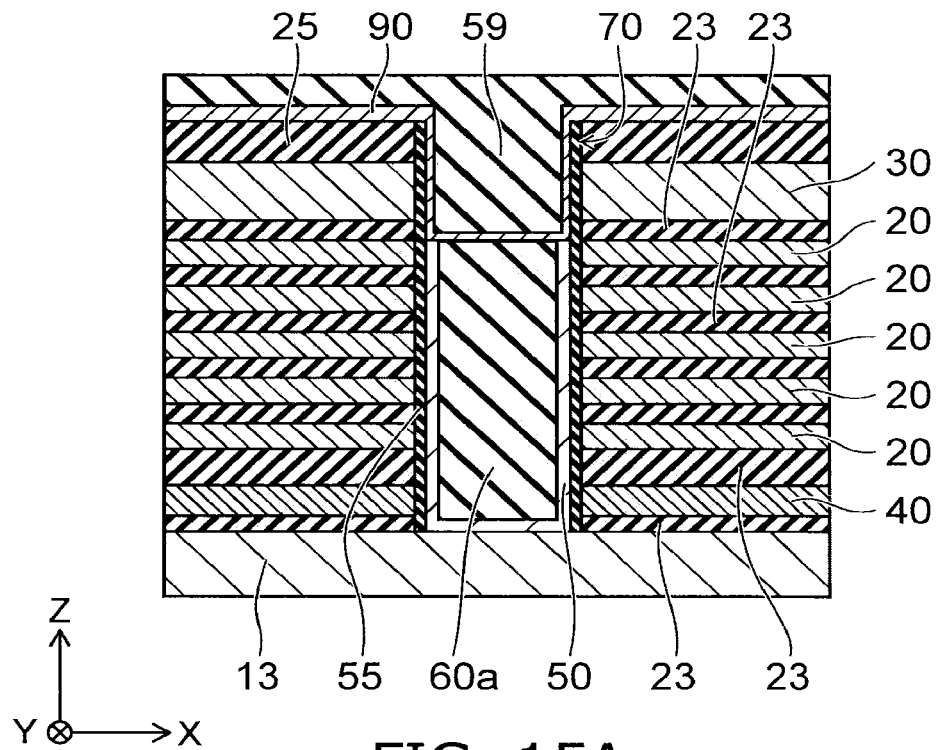

As shown in FIG. 15A, an insulating film 59 is formed to fill the upper part of the memory hole 70. The insulating film 59 is formed also on the interlayer insulating film 25. For example, the insulating film 59 is made of a material that is capable of selectively etching against the interlayer insulating film 25 and the semiconductor layer 90. The insulating film 59 is, for example, a silicon nitride film.

Figure 15B:
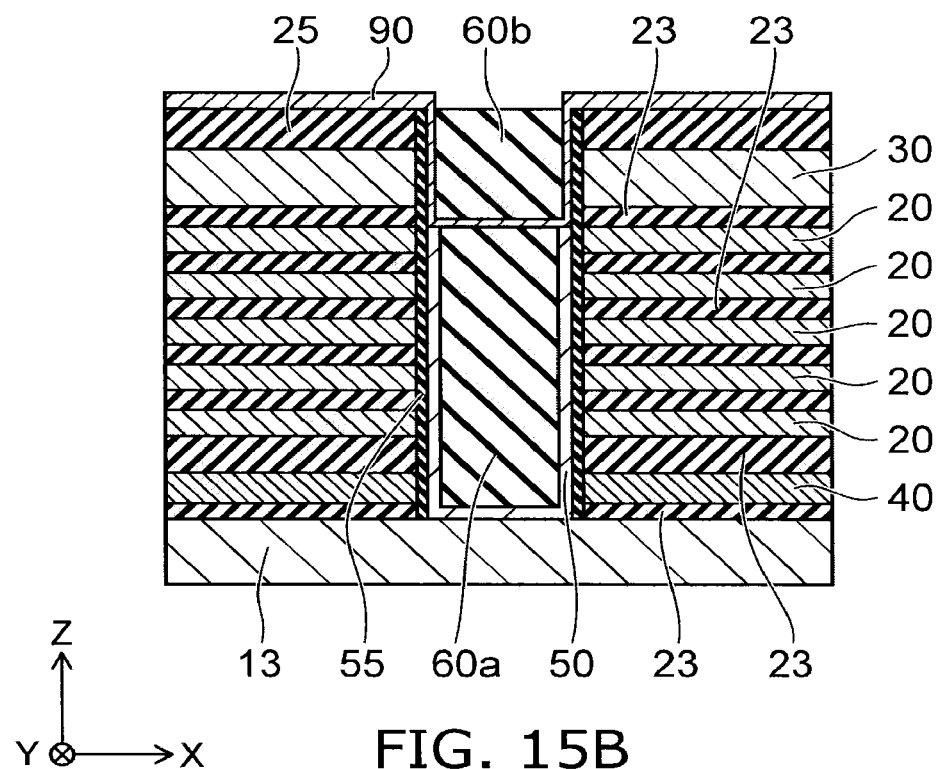

As shown in FIG. 15B, the insulating film 59 is etched back to form a core layer 60b inside the memory hole 70. The semiconductor layer 90 is exposed on the interlayer insulating film 25.

Figure 16A:
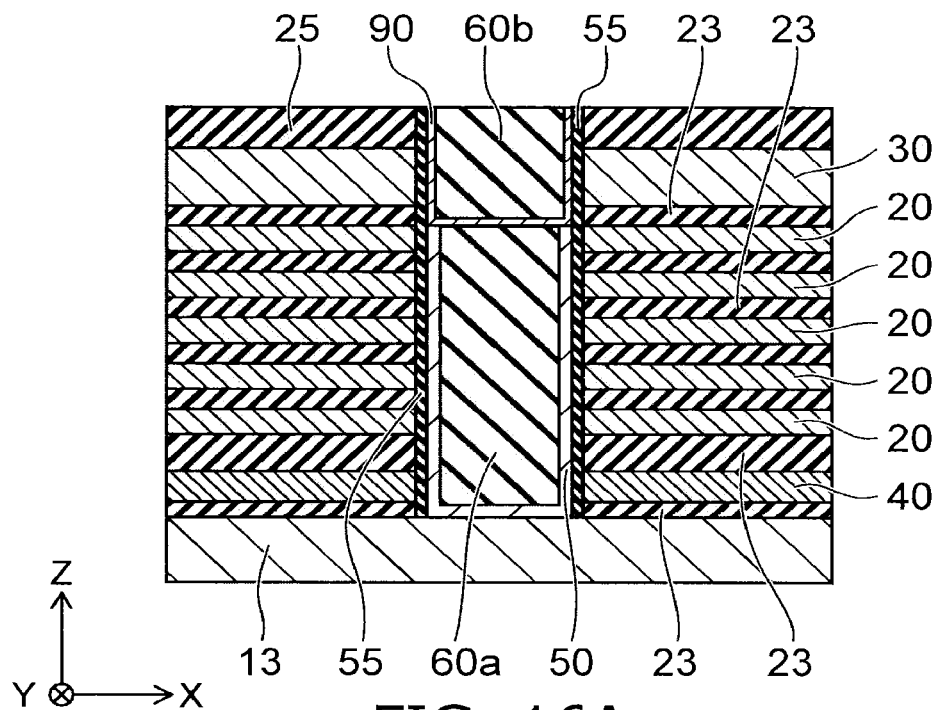
Figure 16B:
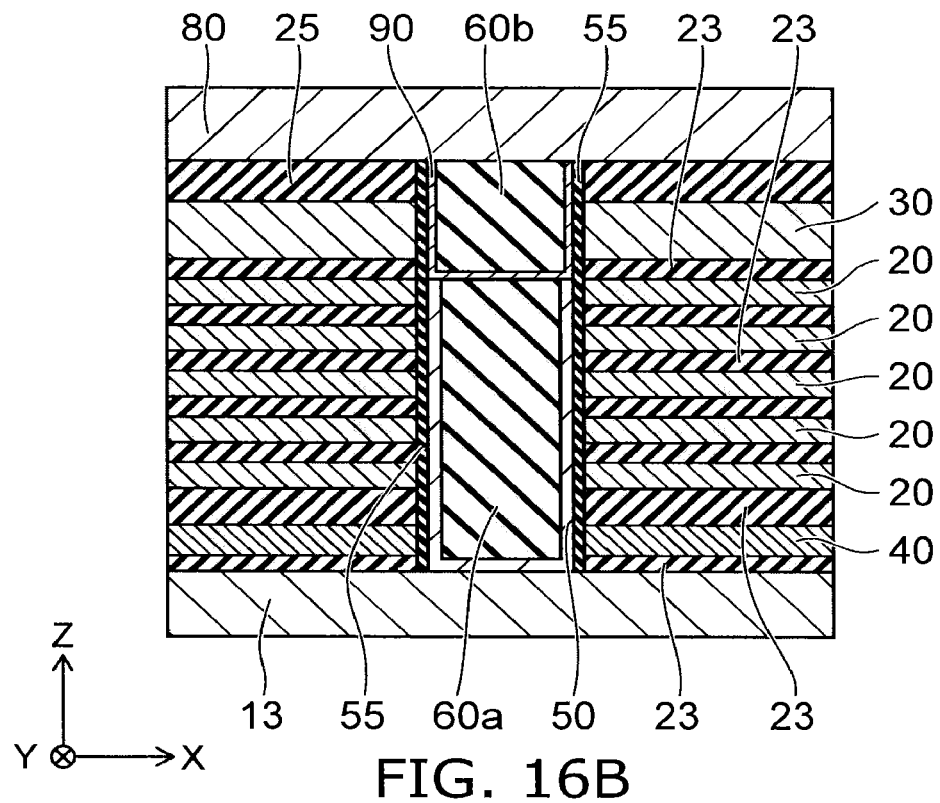

As shown in FIG. 16A, the portion of the semiconductor layer 90 on the interlayer insulating film 25 is removed by etching. Next, as shown in FIG. 16B, a bit line 80 is formed on the interlayer insulating film 25 and the core layer 60b to complete a memory cell array 3. The bit line 80 is in contact with the semiconductor layer 90 exposed between the core layer 60b and the interlayer insulating film 25, and electrically connected to the semiconductor layer 90.

In the embodiment, the semiconductor layer 90 is used as the gate channel portion 90a of the select transistor ST1 to suppress its channel leak current. For example, the thickness of the semiconductor layer 90 is formed to be thinner than the thickness of the semiconductor layer 50 in the direction orthogonal to the Z-direction. Thus, the cutoff characteristics of the select transistor ST1 may be improved while maintaining the current flowing through the semiconductor layer 50.

Figure 17A:
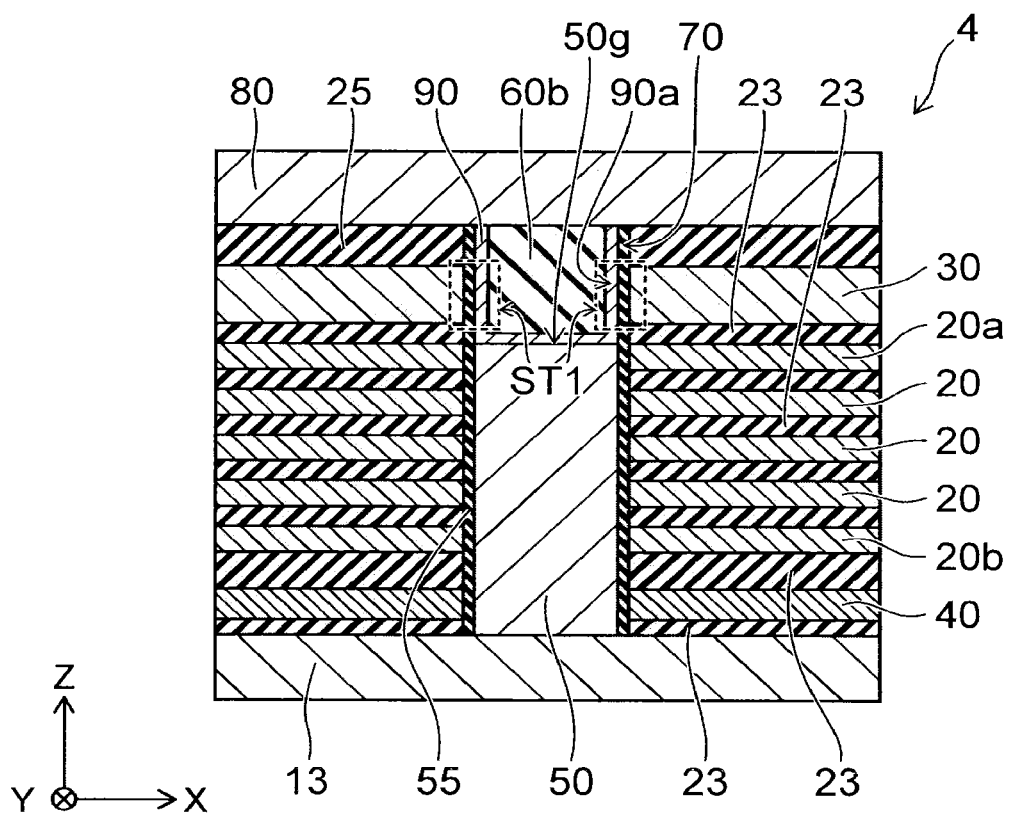
FIGS. 17A and 17B are schematic cross-sectional views illustrating examples of a memory cell array according to a variation of the second embodiment.

FIG. 17A is a schematic sectional view showing a memory cell array 4 according to a variation of the second embodiment. The memory cell array 4 includes a memory hole 70 piercing through a plurality of word lines 20, an insulating film 23, and select gates 30 and 40. The memory cell array 4 includes a semiconductor layer 50, a semiconductor layer 90, and a core layer 60b inside the memory hole 70.

The semiconductor layer 50 is provided to fill the lower part of the memory hole 70. A memory film 55 is provided between the semiconductor layer 50 and each of the word lines 20. The memory film 55 extends between the semiconductor layer 50 and the select gate 40. The upper surface 50g of the semiconductor layer 50 is located between the uppermost layer 20a of the word lines 20 and the select gate 30. This may decrease the resistance of the semiconductor layer 50 and increase the current flowing in the semiconductor layer 50.

A semiconductor layer 90 is provided on the semiconductor layer 50 inside the memory hole 70. The semiconductor layer 90 is provided to cover the upper surface 50g of the semiconductor layer 50 and the upper sidewall of the memory hole 70. The core layer 60b is provided on the semiconductor layer 90 and fills the upper part of the memory hole 70. As a result, the core layer 60b is provided so as to pierce through the select gate 30.

The semiconductor layer 90 is provided between the select gate 30 and a core layer 60a. The semiconductor layer 90 includes a portion located between the semiconductor layer 50 and the core layer 60b. The memory film 55 extends between the select gate 30 and the semiconductor layer 90.

The carrier trap level density in the semiconductor layer 90 is lower than the carrier trap level density in the semiconductor layer 50. The semiconductor layer 50 is made of polysilicon, for example. The semiconductor layer 90 is, for example, an oxide semiconductor.

The gate channel portion 90a of the select transistor ST1 is made of a semiconductor that has a lower carrier trap level density than the memory channel portion 50a. This makes it possible to suppress the channel leak current of the select transistor ST1, and improve the cutoff characteristics of the select transistor ST1.

Figure 17B:
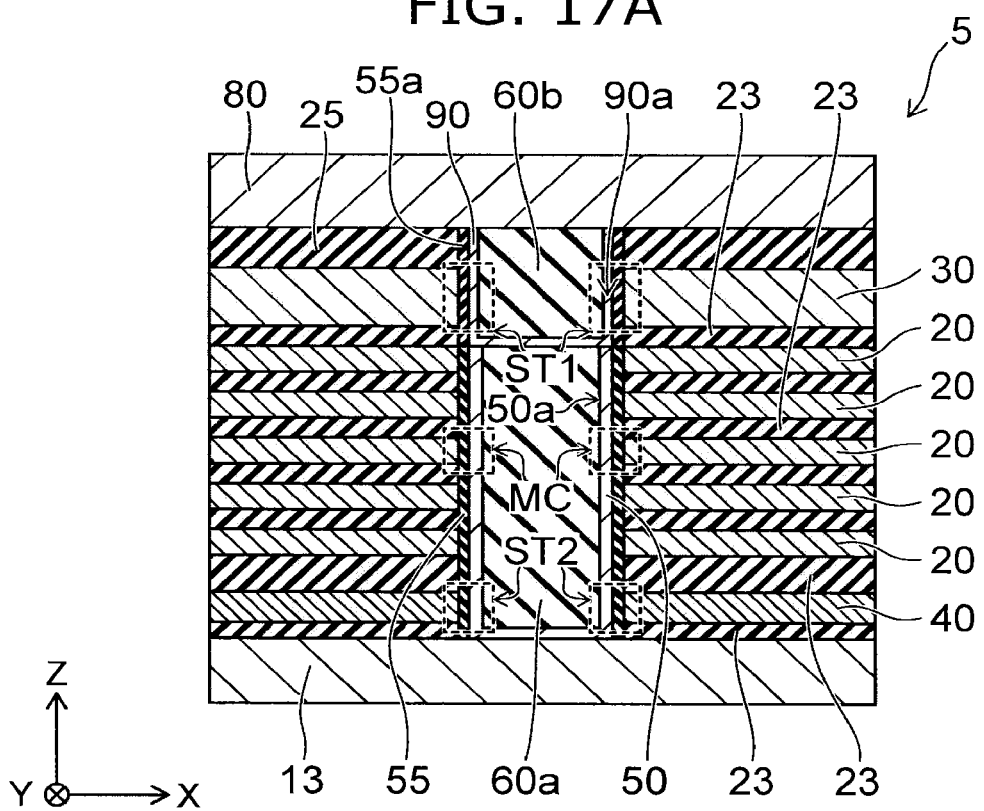

FIG. 17B is a schematic sectional view showing a memory cell array 5 according to another variation of the second embodiment. A gate insulating film 55a is formed between the select gate 30 and the gate channel portion 90a. Here, the gate insulating film 55a is, for example, a single layer of silicon oxide, or a silicon oxide film that contains nitrogen. The lower surface of the gate insulating film 55a is in contact with the upper surface of the memory film 55. The lower surface of the gate insulating film 55a is located at the same level as the lower surface of the semiconductor layer 90. Thus, it is possible to prevent the select transistor ST1 from the variation in the threshold voltage by using the gate insulating film 55a in the select transistor ST1.

The structure shown in FIG. 17B is formed, for example, by completely removing the memory film 55 exposed from the core layer 60a and then forming a gate insulating film 55a in the manufacturing step of FIG. 14A.

Although referring to the semiconductor layer 90 in the embodiment described above as a layer with the carrier trap level density lower than that in the semiconductor layer 50, the embodiment is not limited thereto. For example, when the semiconductor 90 is made of a material that has a same carrier trap level density as that of the semiconductor layer 50 or more, a similar advantage in the embodiment described above is obtained by forming the semiconductor layer 90 with a thickness in a direction perpendicular to the Z-direction more thinner than a thickness of semiconductor layer 90 described in the second embodiment.

Third Embodiment

Figure 18:
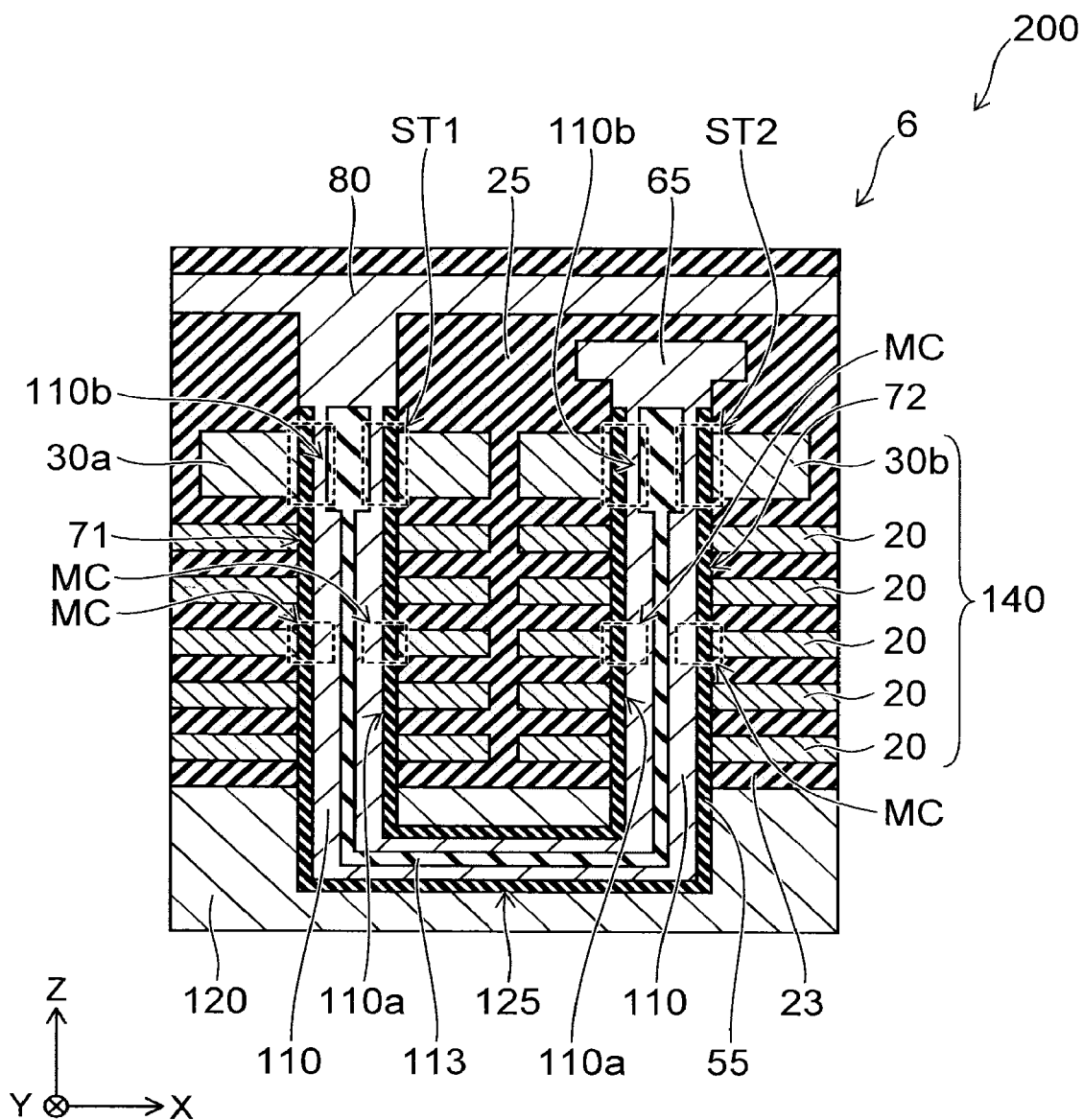
FIG. 18 is a schematic cross-sectional view illustrating an example of a non-volatile memory device according to a third embodiment.

FIG. 18 is a schematic sectional view showing a non-volatile memory device 200 according to a third embodiment. FIG. 18 is a schematic sectional view of a memory cell array 6 of the non-volatile memory device 200.

The memory cell array 6 includes a plurality of stacked bodies 140 arranged in the X-direction. The stacked body 140 includes a plurality of word lines 20 and a select gate 30. A conductive layer (hereinafter back gate 120) is provided between the stacked body 140 and an underlying layer 10 (not shown). The memory cell array 6 includes an insulating film 23. The insulating film 23 electrically insulates the word lines 20, the select gate 30, and the back gate 120 from each other.

The memory cell array 6 includes memory holes 71 and 72. For example, the memory holes 71 and 72 pierce in the Z-direction through the word lines 20, the insulating film 23, and the select gate 30. The memory holes 71 and 72 respectively pierce through the stacked bodies 140 adjacent to each other in the X-direction. The lower end of the memory holes 71 and 72 is located in the back gate 120. The memory holes 71 and 72 are connected by a PC (pipe connection) 125 in the back gate 120.

A memory film 55, a semiconductor layer 110, and a core layer 113 are stacked in this order on the inner surface of the memory holes 71, 72 and the PC 125. The memory film 55 is provided between each of the word lines 20 and the semiconductor layer 110. In the memory hole 71, the memory film 55 may extend between the select gate 30a and the semiconductor layer 110. The memory film 55 can extend between the select gate 30b and the semiconductor layer 110. The core layer 113 fills the inside of the memory holes 71, 72 and the PC 125.

The memory cell array 6 includes a memory cell MC located between the semiconductor layer 110 and each of the word lines 20. The memory cell array 6 includes select transistors ST1 and ST2 located respectively between the semiconductor layer 110 and the select gate 30a, and between the semiconductor layer 110 and the select gate 30b. The semiconductor layer 110 includes a memory channel portion 110a in the portion penetrating through each of the word lines 20. The semiconductor layer 110 includes gate channel portions 110b respectively in the portion piercing through the select gates 30a and 30b. The semiconductor layer 110 is electrically connected to a source line 65 and a bit line 80 above the gate channel portions 110b.

The gate channel portion 110b has a thickness in the direction orthogonal to the Z-direction thinner than any part of the memory channel portion 110a. This can reduce the channel leakage current of the select transistor ST1 provided on the bit line 80 side and the select transistor ST2 provided on the source line 65 side. In the embodiment, misselection and the like of the memory cell MC may be effectively suppressed by improving the cutoff characteristics of the select transistors ST1 and ST2 located at both ends of the memory string provided through the memory holes 71 and 72.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A nonvolatile semiconductor memory device comprising:
an underlying insulating layer provided above a substrate;
a conductive layer provided above the underlying insulating layer;
memory cells including a plurality of first electrodes alternately stacked with a plurality of first insulating layers therebetween in a first direction above the conductive layer, a memory channel portion extending in the first direction through the first electrodes and having a ring shape in a cross section crossing the first direction, and a memory film provided between at least one of the first electrodes and the memory channel portion;
a wiring provided above the memory cells;
a first select transistor provided between the memory cells and the wiring in the first direction, the first select transistor including a second electrode, an upper gate channel portion extending in the first direction through the second electrode, and an upper insulator core portion provided inside the upper gate channel portion, one end of the upper gate channel portion being electrically connected to the memory channel portion and the other end of the upper gate channel portion being electrically connected to the wiring; and
a second select transistor provided between the memory cells and the conductive layer in the first direction, the second select transistor including a third electrode, a lower gate channel portion extending in the first direction through the third electrode, and a lower insulator core portion provided inside the lower gate channel portion, one end of the lower gate channel portion being electrically connected to the memory channel portion and the other end of the lower gate channel portion being electrically connected to the conductive layer, wherein
the upper insulator core portion continuously extends in the first direction through the second electrode and at least an uppermost electrode of the first electrodes inside the upper gate channel portion and the memory channel portion having the ring shape, and
a second insulating layer is provided on the third electrode and a lowermost electrode of the first electrodes is provided on the second insulating layer, a thickness of an uppermost first insulating layer of the first insulating layers being thinner than a thickness of the second insulating layer in the first direction, the uppermost first insulating layer being adjacent to the uppermost electrode in the first direction below the uppermost electrode.

2. The device according to claim 1, wherein the upper insulator core portion continuously extends in the first direction through the second electrode and at least three layers of the first electrodes inside the upper gate channel portion and the memory channel portion having the ring shape.

3. The device according to claim 1, wherein a thickness of the upper gate channel portion in a second direction orthogonal to the first direction is thinner than a thickness of the memory channel portion in the second direction.

4. The device according to claim 1, wherein a thickness of the second electrode in the first direction is thicker than respective thicknesses of the first electrodes in the first direction.

5. The device according to claim 1, wherein an upper surface of the second electrode is positioned at a level under an upper end of the upper insulator core portion in the first direction.

6. The device according to claim 1, wherein an upper end of the upper insulator core portion is positioned at a level under an upper end of the upper gate channel portion in the first direction.

7. The device according to claim 1, wherein the second select transistor further includes a lower insulator core portion provided inside the lower gate channel portion.

8. A nonvolatile semiconductor memory device comprising:
an underlying insulating layer provided above a substrate;
a conductive layer provided above the underlying insulating layer;
memory cells including a plurality of first electrodes alternately stacked with a plurality of first insulating layers therebetween in a first direction above the conductive layer, a memory channel portion extending in the first direction through the first electrodes and having a ring shape in a cross section crossing the first direction, and a memory film provided between at least one of the first electrodes and the memory channel portion;

a wiring provided above the memory cells;

a first select transistor provided between the memory cells and the wiring in the first direction, the first select transistor including a second electrode, an upper gate channel portion extending in the first direction through the second electrode, and an upper insulator core portion provided inside the upper gate channel portion, one end of the upper gate channel portion being electrically connected to the memory channel portion and the other end of the upper gate channel portion being electrically connected to the wiring; and a second select transistor provided between the memory cells and the conductive layer in the first direction, the second select transistor including a third electrode, a lower gate channel portion extending in the first direction through the third electrode, and a lower insulator core portion provided inside the lower gate channel portion, one end of the lower gate channel portion being electrically connected to the memory channel portion and the other end of the lower gate channel portion being electrically connected to the conductive layer, wherein the lower insulator core portion continuously extends in the first direction through the third electrode and at least a lowermost electrode of the first electrodes inside the lower gate channel portion and the memory channel portion having the ring shape, and a second insulating layer is provided on the third electrode and the lowermost electrode of the first electrodes is provided on the second insulating layer, a thickness of a lowermost first insulating layer of the first insulating layers being thinner than a thickness of the second insulating layer in the first direction, the lowermost first insulating layer being adjacent to the lowermost electrode in the first direction above the lowermost electrode.

9. The device according to claim 8, wherein a part of the upper gate channel portion extends between the lower insulator core portion and the upper insulator core portion.

10. The device according to claim 8, wherein a thickness of the upper gate channel portion in a second direction orthogonal to the first direction is thinner than a thickness of the memory channel portion in the second direction.

11. The device according to claim 8, wherein the first select transistor further includes a gate insulating film provided between the second electrode and the upper gate channel portion, the gate insulating film being different in material from the memory film.

12. The device according to claim 8, wherein a thickness of the second electrode in the first direction is thicker than respective thicknesses of the first electrodes in the first direction.

13. The device according to claim 8, wherein an upper surface of the second electrode is positioned at a level under an upper end of the upper insulator core portion in the first direction.

14. The device according to claim 8, wherein an upper end of the upper insulator core portion is positioned at a level under an upper end of the upper gate channel portion in the first direction.

15. A nonvolatile semiconductor memory device comprising:

an underlying insulating layer provided above a substrate;

a conductive layer provided above the underlying insulating layer;

memory cells including a plurality of first electrodes alternately stacked with a plurality of first insulating layers therebetween in a first direction above the conductive layer, a memory channel portion extending in the first direction through the first electrodes and having a ring shape in a cross section crossing the first direction, and a memory film provided between at least one of the first electrodes and the memory channel portion;

a wiring provided above the memory cells;

a first select transistor provided between the memory cells and the wiring in the first direction, the first select transistor including a second electrode, an upper gate channel portion extending in the first direction through the second electrode, and an upper insulator core portion provided inside the upper gate channel portion, one end of the upper gate channel portion being electrically connected to the memory channel portion and the other end of the upper gate channel portion being electrically connected to the wiring; and a second select transistor provided between the memory cells and the conductive layer in the first direction, the second select transistor including a third electrode, a lower gate channel portion extending in the first direction through the third electrode, and a lower insulator core portion provided inside the lower gate channel portion, one end of the lower gate channel portion being electrically connected to the memory channel portion and the other end of the lower gate channel portion being electrically connected to the conductive layer, wherein the upper insulator core portion continuously extends in the first direction through the second electrode and at least an uppermost electrode of the first electrodes inside the upper gate channel portion and the memory channel portion having the ring shape, the lower insulator core portion continuously extends in the first direction through the third electrode and at least a lowermost electrode of the first electrodes inside the lower gate channel portion and the memory channel portion having the ring shape, and a second insulating layer is provided on the third electrode and the lowermost electrode of the first electrodes is provided on the second insulating layer, a thickness of an uppermost first insulating layer of the first insulating layers and a thickness of a lowermost first insulating layer of the first insulating layers being thinner than a thickness of the second insulating layer in the first direction, the uppermost first insulating layer being adjacent to the uppermost electrode in the first direction below the uppermost electrode and the lowermost first insulating layer being adjacent to the lowermost electrode in the first direction above the lowermost electrode.

16. The device according to claim 15, wherein the upper insulator core portion continuously extends in the first direction through the second electrode and at least three layers of the first electrodes inside the upper gate channel portion and the memory channel portion having the ring shape.

17. The device according to claim 15, wherein a thickness of the upper gate channel portion in a second direction orthogonal to the first direction is thinner than a thickness of the memory channel portion in the second direction.

18. The device according to claim 15, wherein a thickness of the second electrode in the first direction is thicker than respective thicknesses of the first electrodes in the first direction.

19. The device according to claim 15, wherein an upper surface of the second electrode is positioned at a level under an upper end of the upper insulator core portion in the first direction.

20. The device according to claim 15, wherein an upper end of the upper insulator core portion is positioned at a level under an upper end of the upper gate channel portion in the first direction.

* * * * *